US008624183B2

(12) United States Patent
Kuijper

(10) Patent No.: US 8,624,183 B2
(45) Date of Patent: Jan. 7, 2014

(54) DETERMINING A RECONSTRUCTED IMAGE WITH VITERBI DETECTION USING A PARTICLE-OPTICAL APPARATUS

(75) Inventor: Maarten Kuijper, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 13/455,988

(22) Filed: Apr. 25, 2012

(65) Prior Publication Data

US 2012/0273676 A1 Nov. 1, 2012

Related U.S. Application Data

(60) Provisional application No. 61/479,149, filed on Apr. 26, 2011.

(30) Foreign Application Priority Data

Apr. 26, 2011 (EP) ...................................... 11163633

(51) Int. Cl.
*G01N 23/00* (2006.01)
*G21K 7/00* (2006.01)

(52) U.S. Cl.
USPC ......................................... 250/307; 250/311

(58) Field of Classification Search
USPC .......... 250/306, 307, 310, 311; 382/226, 228, 382/238, 240
See application file for complete search history.

(56) References Cited

U.S. PATENT DOCUMENTS

| 5,432,347 | A | | 7/1995 | Coene |
| 5,654,547 | A | * | 8/1997 | Coene et al. ..................... 850/21 |
| 5,753,913 | A | | 5/1998 | Coene et al. |
| 6,115,436 | A | * | 9/2000 | Ramesh et al. ................ 375/341 |
| 6,800,864 | B2 | * | 10/2004 | Scaman .................... 250/492.22 |
| 6,882,959 | B2 | * | 4/2005 | Rui et al. ....................... 702/179 |
| 6,888,136 | B2 | | 5/2005 | Geurts et al. |
| 2003/0006373 | A1 | * | 1/2003 | Koguchi et al. ............... 250/311 |
| 2006/0029286 | A1 | * | 2/2006 | Lim et al. ...................... 382/260 |
| 2008/0251719 | A1 | * | 10/2008 | Nakahira et al. .............. 250/311 |
| 2009/0316558 | A1 | * | 12/2009 | Hashimoto et al. ........... 369/103 |
| 2010/0008201 | A1 | * | 1/2010 | Hashimoto et al. ........ 369/59.22 |
| 2011/0248163 | A1 | * | 10/2011 | Morris et al. ................. 250/307 |

FOREIGN PATENT DOCUMENTS

| EP | 0760109 | 5/1997 |
| EP | 2416165 | 2/2012 |

OTHER PUBLICATIONS

Miller et al. ("Image Restoration with the Viterbi Algorithm" vol. 17, No. 2, Feb. 2000, J. Opt. Soc. Am. A. 265-275).*
Miller, C. et al., "Image Reconstruction Using the Viterbi Algorithm," Image Analysis and Interpretation, Apr. 5, 1998, p. 160-163.

(Continued)

*Primary Examiner* — David A Vanore
*Assistant Examiner* — Brooke Purinton
(74) *Attorney, Agent, or Firm* — Scheinberg & Associates, PC; Michael O. Scheinberg

(57) ABSTRACT

The invention relates to a method for determining a reconstructed image using a particle-optical apparatus. The particle-optical apparatus comprises a particle source for producing a beam of particles, an object plane on which an object to be imaged may be placed, a condenser system for illuminating the object plane with the beam of particles, a projection system for forming an image of the object plane by imaging particles transmitted through the object on an image plane, and a detector for detecting the image, the detector comprising a semiconductor sensor having an array of pixels for providing a plurality of pixel signals from respective pixels of the array in response to particles incident on the detector.

20 Claims, 22 Drawing Sheets

(56) References Cited

OTHER PUBLICATIONS

Chung, Pei-Jung et al., "A GLRT and Bootstrap Approach to Detection in Magnetic Resonance Force Microscopy," IEEE International onference on Montreal, Quebec, Canada, May 17-21, 2004, p. 1061-1064.

* cited by examiner

DETERMINING A RECONSTRUCTED IMAGE WITH VITERBI DETECTION USING A PARTICLE-OPTICAL APPARATUS

This application claims priority from U.S. Provisional Patent Application 61/479,149, filed Apr. 26, 2011, which is hereby incorporated by reference.

TECHNICAL FIELD OF THE INVENTION

The invention relates to a method for determining a reconstructed image using a particle-optical apparatus.

BACKGROUND OF THE INVENTION

In a TEM an object, also referred to as a sample, is irradiated with a beam of electrons, the electrons having an energy of e.g. between 50 keV and 400 keV. Some of the electrons are transmitted through the sample, and these electrons are focused on the image plane to form an enlarged image of the sample. The imaging of the sample on the image plane is realized with a projection system, that can be set to a configurable magnification of e.g. between $10^3$ and $10^6$ times. Typically a detector, such as a CCD camera or CMOS camera, is placed in the image plane, whereby the image is detected. Such detector may e.g. have a semiconductor sensor having 4 k×4 k pixels arranged in a two-dimensional array. With such detector, the electrons impinge on the semiconductor chip of the CCD or CMOS sensor and generate electron hole pairs, thereby forming the charge to be detected by the CCD or CMOS chip.

For some applications, a very low dose of electrons is required. For example, biological materials may already degrade at doses of 10-30 electrons per 0.1 nm×0.1 nm within a frame time of 8-10 seconds. This may result in an average dose of 0.001-0.1 electrons per pixel or even less at the detector. Although CCD and CMOS cameras are constantly improving, Signal to Noise Ratio (SNR) and Modulation Transfer Function (MTF) may still be limiting the performance of the detector. For an exemplary direct electron detection CMOS camera in a TEM, one incident electron may generate thousands of electron hole pairs which diffuse over an area of e.g. 5×5 pixels and finally generate about a total of 240 output signal counts in the 5×5 pixels. As a result, the Point Spread Function (PSF) may be significant larger than the spatial sampling dimensions (one pixel). In the following, any reference to the length of the PSF may refer to the width of the PSF in terms of number of pixels: the length is five when the electron hole pairs diffuse over an area of 5×5 pixels. At halve-Nyquist frequency of the sensor, an MTF less than 0.5 is achieved. The MTF at Nyquist is approaching to zero. This results in a loss of MTF and thus resolution. Secondly, the peak count at the center pixel may be roughly 30 counts, while the dark current noise of the semiconductor sensor may typically vary between 0 and 30 counts. This results in an SNR around 1. At these low doses, both SNR and MTF determine the image quality. Due to the relatively high noise level, known image improvement technologies like image deconvolution are not very successful to recover from this noise and point spread function. Besides the dark current noise, also the number of electron hole pairs that are being generated in the semiconductor sensor for a single incident electron, and thus of the deposited energy per electron, may vary wildly and affect the SNR. One incident electron of 300 keV may e.g. result in any number of electron hole pairs between 0 and 80.000 and a corresponding spread in detected charge. In the following, the charge detected by a pixel of the semiconductor chip will be represented by a corresponding pixel signal with a signal strength representing a certain number of signal counts.

It is known to determine whether an electron is present on a pixel by comparing the pixel signal to a predetermined reference level in so-called threshold detection. However, such threshold detection may result in many misdetections when the dose is low and when the SNR around 1.

To overcome the effects of the Point Spread Function, it has been proposed to use Partial Response (PR) detection, using a Partial Response function resembling the Point Spread Function. For binary images, a Partial Response Maximum Likelihood (PRML) detection and Viterbi Detection have been proposed with success. However, the inventor has found that such known methods do not give a satisfactory results when applied to an image obtained in a TEM, especially not in the presence of SNR is around 1 and/or when the spread in signal counts for a single incident electron is large.

A disadvantage of the aforementioned methods is that the achievable resolution may be compromised. Especially when the dose is low, it may not be possible to determine the number of incident electrons on each pixel with a sufficient reliability.

Accordingly, there is a need to provide a method wherein the quality of an image acquired by a detector in a particle-optical apparatus, such as a TEM, is improved, especially at low dose and where the signal of a single incident particle, such as an electron, is spread over a plurality of pixels, e.g. due to diffusion in the semiconductor sensor.

SUMMARY OF THE INVENTION

An object of the invention is to improve the quality of an image acquired by a detector in a particle-optical apparatus, such as a TEM.

The invention relates to a method for determining a reconstructed image using a particle-optical apparatus. The particle-optical apparatus comprises a particle source for producing a beam of particles, an object plane on which an object to be imaged may be placed, a condenser system for illuminating the object plane with the beam of particles, a projection system for forming an image of the object plane by imaging particles transmitted through the object on an image plane, and a detector for detecting the image, wherein the detector comprising a semiconductor sensor having an array of pixels for providing a plurality of pixel signals from respective pixels of the array in response to particles incident on the detector.

The invention further relates to a particle-optical apparatus arranged to execute such method for determining a reconstructed image.

The invention further relates to a computer program product comprising instructions for causing a processor system to perform such method.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 8-FIG. 9 illustrate examples of states for use with other embodiments.

The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION OF PREFERRED EMBODIMENTS

Figure 1:
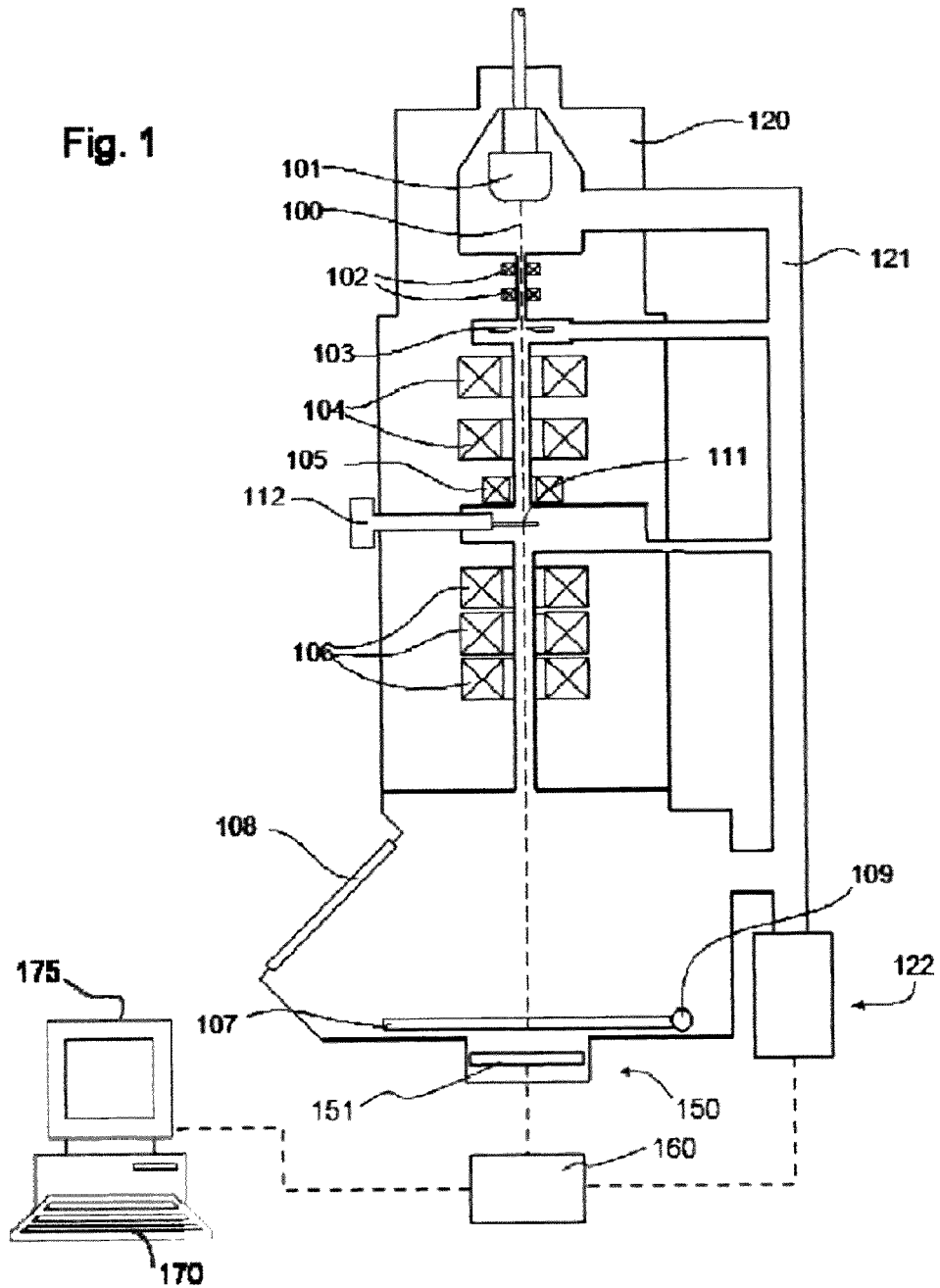
FIG. 1 schematically shows an apparatus according to the invention.

Embodiments of the invention provides a method wherein the quality of an image acquired by a detector in a particle-optical apparatus, such as a TEM, is improved, especially at low dose and where the signal of a single incident particle, such as an electron, is spread over a plurality of pixels, e.g. due to diffusion in the semiconductor sensor.

A method according to one embodiment of the invention comprises: receiving the plurality of pixel signals, and determining a reconstructed image from using Viterbi Detection on the plurality of pixel signals, the Viterbi Detection using a plurality of different states corresponding to a plurality of configurations of particles incident on the detector, and at least two states of the plurality of different states corresponding to a same, non-zero multiplicity of incident particles on a single pixel of the plurality of pixel signals.

The non-zero multiplicity of incident particles on the single pixel may in particular be one, whereby the at least two states of the plurality of different states correspond to a single electron being incident on the single pixel. In this embodiment, the Viterbi Detection may use a first state of the plurality of different states wherein a single electron is incident on a pixel and generates a first pixel signal, i.e. a first number of pixel counts, and a second state of the plurality of different states wherein again a single electron is incident on the pixel, but wherein the single electron generates a different, second pixel signal, i.e. a second number of pixel counts different from the first number. The first and second state may thus both relate to configurations wherein a single electron is incident on the pixel, but with different signal count. The Viterbi Detection may thus successfully account for the large spread in generated number of electron hole pairs from a single incident electron and the corresponding spread in detected charge, in contrast to known Viterbi Detection schemes wherein no such plurality comprising at least such first state and such second state is used.

In an embodiment of the method according to the invention, the different states are modelled using a different multiplicity of particles.

In this embodiment, the states may e.g. be modeled as if all electrons generate substantially the same number of electron hole pairs and therefore substantially the same pixel signal, i.e. a predetermined signal count. The first state may then be modeled as one electron with the corresponding predetermined pixel count, whereas the second state may be modeled as two electrons, each generating the corresponding predetermined pixel count, i.e., with twice the pixel count of a single electron. When the Viterbi Detection decides that the second state is the most likely state, the Viterbi Detection will however output that a single electron was present. Especially when the dose is relatively low and when the predetermined signal count is suitably selected, this may improve the reconstructed image, as the likelihood of having two electrons on a single pixel may then be significantly smaller than the likelihood that a single electron has resulted in a larger signal count.

In an embodiment of the method according to the invention, the different states are modelled using different deposited energies of the particle(s).

In this embodiment, the states of the Viterbi Detection explicitly take into account that a single electron may result in different pixel counts. The first state may e.g. relate to a single electron of a first predetermined signal count and the second state may e.g. relate to a single electron of a second, different predetermined signal count, the second predetermined signal count being e.g. twice the first predetermined signal count. The Viterbi Detection will thus not only result in the determination whether an electron was incident on a pixel, but, when it was present, also provide the likely signal count of the electron.

In an embodiment of the method according to the invention, the different states are modelled using different point spread functions in modelling deposited energies of the particle(s).

In this embodiment, the first state may e.g. relate to a single electron generating pixel counts in a plurality of neighboring pixels according to a first point spread function, and the second state may e.g. relate to a single electron generating pixel counts in a plurality of neighboring pixels according to a second point spread function, the second point spread function being different from the first point spread function. The Viterbi Detection may thus account for possible different signal count distributions in response to a single electron being incident on a pixel. The different point spread functions may e.g. corresponds to a different relative amplitude and/or a different shape and/or a different length.

In an embodiment of the method according to the invention, the different states are used in different iterations of the Viterbi Detection.

In this embodiment, the Viterbi Detection uses in e.g. a first iteration a first state corresponding to an incident electron resulting in a first, large pixel count, and a second iteration wherein a second state is used corresponding to an incident electron resulting in a second, smaller pixel count. After the first iteration, contributions from all detected electrons may be modeled and removed from the pixel signals. Hereby, the first iteration detects electrons with a high pixel count and the second iteration detects electrons with a low pixel count.

Preferably, the states used in successive iterations correspond to decreasing signal level of a single electron.

In an embodiment of the method according to the invention, wherein the array of pixels is a one-dimensional array.

The semiconductor sensor thus forms a line sensor, which may e.g. be scanned along the image plane. Using such line sensor may be advantageous because of reduced computational complexity and memory requirements, as the Viterbi Detection only has to accommodate for contributions from neighboring pixels in one dimension. The Viterbi Detection may thus use a smaller number of states compared to the situation wherein a two-dimensional array is used, and states have to be considered wherein an electron is incident in a two-dimensional environment of the pixel.

In an embodiment of the method according to the invention, the array of pixels is a two-dimensional array and the Viterbi Detection is applied to sequences of pixel signals per row of pixels of the two-dimensional array.

In this embodiment, the Viterbi Detection substantially operates row-by-row. Hereby, the number of states—and hence computational complexity and memory requirements—that are being considered in the Viterbi Detection is reduced compared to a full two-dimensional Viterbi Detection, whereas the benefits of using Viterbi Detection largely remain. The Viterbi Detection preferably uses a two-dimensional PSF and considers the contributions of pixels in a two-dimensional area around the pixels on the row for each state, in order to optimally model the pixel signal.

In an embodiment of the method according to the invention, the array of pixels is a two-dimensional array and the Viterbi Detection is applied to sequences of pixel signals per column of pixels of the two-dimensional array.

In this embodiment, the Viterbi Detection substantially operates column-by-column, with similar advantages and effects as when operating row-by-row.

In a further embodiment, the Viterbi Detection uses a first iteration with a row-by-row operation and a second iteration with a column-by-column operation, after which the results of the first and second iteration are combined to obtain the output of the Viterbi Detection. The combining may e.g. comprises an averaging, or a selection based on determined path metrics obtained from first and second iterations.

In further embodiments, the states of the Viterbi Detection correspond to predetermined two-dimensional configurations of particles incident on the detector.

The Viterbi Detection may thus e.g. determine contributions from particles incident on the respective pixel on the row or column, as well as from particles incident on pixels of neighboring rows or columns, which may also contribute to the pixel signal. This embodiment may be referred to as strip-wise Viterbi Detection.

In an embodiment of the method according to the invention, the method further comprises, after having detected one or more incident particles on a pixel, removing a contribution from the detected one or more incident particles from the plurality of pixel signals.

In this embodiment, the plurality of pixel signals that is being considered is substantially free from the contributions from electrons that have already been detected. Computational complexity and/or robustness may thus be improved.

In an embodiment of the method according to the invention, the Viterbi Detection uses a PR (13531) or PR (13531)$^2$ response.

Such PR responses have been found to result in a good balance between computational complexity and memory requirements and performance of the Viterbi Detection. The plurality of pixels of semiconductor sensor may be dimensioned and arranged such that the diffusion pattern substantially corresponds to a point spread function corresponding to such PR responses.

An alternative PR response may be used, and e.g. selected in accordance with an energy deposition pattern of a particle incident on the semiconductor sensor.

In embodiments of the method according to the invention, the Viterbi Detection uses a path memory length in a range of 2-5, preferably 2-4, even more preferably 3-4, times the length of a Point Spread Function used in the Viterbi Detection, the Point Spread Function corresponding to a PR-response used in the Viterbi Detection.

The inventors have found that, with the length of the path memory is chosen in the indicated ranges, a good balance between computational complexity and memory requirements and performance of the Viterbi Detection is obtained.

In an embodiment of the method according to the invention, the image detected by the detector comprises a dose in a range of 0.0001-0.5, preferably 0.001-0.3, even more preferably 0.01-0.1 particle per pixel.

The inventors have found that the Viterbi Detection according to the invention when the dose is in the ranges indicated. These ranges are particularly suitable for allowing a reasonably low number of states, and thus reasonable computational complexity, while maintaining a good performance.

In an embodiment of the method according to the invention, the method comprises:

receiving a first plurality of pixel signals from respective pixels of the array in response to particles incident on the detector upon detecting a first image of the object, determining a first reconstructed image from using the Viterbi Detection on the first plurality of pixel signals, receiving a second plurality of pixel signals from the respective pixels of the array in response to particles incident on the detector upon detecting a second image of the object, determining a second reconstructed image from using the Viterbi Detection on the second plurality of pixel signals, and combining the first reconstructed image and the second reconstructed image to form the reconstructed image.

The method may further comprise receiving at least one further plurality of pixel signals from the respective pixels of the array in response to particles incident on the detector upon detecting at least one respective further image of the object, determining at least one further reconstructed image from using the Viterbi Detection on the respective further plurality of pixel signals, and combining the first reconstructed image, the second reconstructed image and the at least one further reconstructed images to form the reconstructed image. Thus, the method acquires and processes two or more reconstructed images of the same object, and combines the corresponding reconstructed images to form the reconstructed image. The two or more reconstructed images may e.g. have been acquired at a low dose, e.g. selected to prevent damage to the object, while the reconstructed image as obtained from combining the two or more reconstructed images may effectively correspond to a higher dose. Hereby, the quality of the reconstructed image may be improved. Combining the first and second (and, if applicable, the further) reconstructed images may e.g. comprise an addition or an averaging of the first and second (and, if applicable, the further) reconstructed images, but may, in further embodiments, comprise correcting for a shift and/or distortion between the first and second (and, if applicable, the further) reconstructed images. The shift and/or distortion may e.g. be determined from the first and second (and, if applicable, the further) reconstructed images that are being combined. The shift and/or distortion may alternatively be predetermined or be provided by other parts of the particle-optical apparatus, e.g. from the projection system.

In some embodiments of the method according to the invention, the method comprises: producing a beam of particles, placing an object to be imaged on an object plane, illuminating the object plane with the beam of particles, forming an image of the object plane by imaging particles transmitted through the object on an image plane, and detecting the image with the detector comprising the semiconductor sensor and providing a plurality of pixel signals from the respective pixels of the array in response to the particles incident on the detector.

A further aspect of the invention provides a particle-optical apparatus comprising: a particle source for producing a beam of particles, an object plane on which an object to be imaged may be placed, a condenser system for illuminating the object plane with the beam of particles, a projection system for forming an image of the object plane by imaging particles transmitted through the object on an image plane, a detector for detecting the image, the detector comprising a semiconductor sensor having an array of pixels for providing a plurality of pixel signals from respective pixels of the array in response to particles incident on the detector, and a signal processor arranged to: receive the plurality of pixel signals, and determine a reconstructed image from using Viterbi Detection on the plurality of pixel signals, the Viterbi Detection using a plurality of different states corresponding to a plurality of configurations of particles incident on the detector, and at least two states of the plurality of different states corresponding to a same, non-zero multiplicity of incident particles on a single pixel of the plurality of pixel signals.

The signal processor may be part of the detector, or be arranged as a separate unit in communication with the detector.

In a further aspect of the invention, a computer program product is provided comprising instructions for causing a processor system to perform the method set forth.

It will be appreciated by those skilled in the art that two or more of the above-mentioned embodiments, implementations, and/or aspects of the invention may be combined in any way deemed useful.

Modifications and variations of the particle-optical apparatus and/or the computer program product, which correspond to the described modifications and variations of the method, can be carried out by a person skilled in the art on the basis of the present description.

FIG. 1 schematically shows an apparatus according to the invention. It shows a TEM, comprising a vacuum housing 120 evacuated via tube 121 by a vacuum pump 122. A particle source in the form of an electron source 101 produces a beam of electrons along a particle-optical axis 100. The particle source may be any type of electron source, such as e.g. a field emitter gun, a Schottky emitter, or a thermionic electron emitter. The electron source can be e.g. a field emitter gun, a Schottky emitter, or a thermionic electron emitter. The electrons are then accelerated to an adjustable energy of typically between 80-300 keV, although TEM's using electrons with an adjustable energy of e.g. 50-500 keV are known. Deflectors 102 centre the beam of particles on beam limiting aperture 103. The beam then passes through a condenser system comprising two lenses 104.

A sample 111 is held by a manipulator 112, positioning the sample in the object plane of the objective lens 105. The sample is imaged by a projection system comprising lenses 106 onto fluorescent screen 107, and can be viewed through a window 108. The fluorescent screen 107 is connected to a hinge 109 and can be retracted/folded away, so that the image made by the projection system is imaged on detector 150. It is noted that the projection system may need to be re-focused so as to form the image on the detector 150 instead of on the fluorescent screen. The image formed on the screen or on the detector typically has a magnification of between $10^3$ to $10^6$ times and may show details as small as 0.1 nm or smaller. It is further noted that the projection system may form intermediate images. The detector 150 comprises a semiconductor sensor 151, such as a charge coupled device (CCD) or a CMOS device, for detecting impinging electrons. The semiconductor sensor 151 has a plurality of pixels (not shown in FIG. 1) arranged in a two-dimensional array. One incident electron may generate thousands of electron hole pairs which diffuse over an area of e.g. 5×5 pixels of the array, where the charge is collected to generate pixel signals. The pixel signals may be referred to as 'raw pixel data' or 'data samples'. The plurality of pixel signals may be referred to as 'raw image'. The detector 150 further comprises a signal processor 152, for processing the pixel signals and determining an improved image, representing a reconstruction of the configuration of electrons incident on the detector 150. The improved image may further be referred to as 'output image'.

It is noted that in alternative embodiments, the plurality of pixels may also be arranged in other configurations, such as in a one-dimensional array, forming a line sensor. The line sensor may be movable relative to the projected image to obtain a sequence of one-dimensional images which together form a two-dimensional image.

It is noted that FIG. 1 shows a schematic description of a typical TEM only, and that in reality a TEM comprises many more deflectors, apertures etc. Also TEM's with correctors for correcting the aberration of the objective lens 105 are known, said correctors employing multipoles and round lenses. Also other detectors may be used, such as secondary electron detectors, X-ray detectors, etc. These detectors may be positioned at the side of the sample facing the gun or the side of the sample facing detector 150.

FIG. 1 further shows an interface device 160 which connects the TEM to a user interface system, herein shown as a computer, having input means 170, such as a keyboard and a mouse, and visualization means 175, such as a display screen. The user interface system may also have a storage device, such as a hard disk drive and an optical disk drive, as well as interfacing devices for connecting with removable solid state storage, such as a USB-stick, and/or for connecting to a network, such as the internet or a local network. The interface device 160 is further connected to the detector 150 for obtaining the output image from the detector 150 and to provide the output image the user interface system. Further, the interface device 160 is connected to the signal processor 152 allowing a user to adapt setting of the signal processor 152. Further, the interface device 160 is connected to the TEM for operating the TEM from the user interface device, e.g. allowing the user to input commands using the input means to operate parts of the TEM, such as e.g. to operate the vacuum pump 122, the electron source 101, the manipulator 112 and the hinged screen 107.

The signal processor 152 is arranged to process the raw pixel signals and to determine an output image, representing a reconstruction of the configuration of electrons incident on the detector 150. It is known to process the raw pixel signals using a threshold detector, which compares each raw pixel signal to a predetermined threshold value, and determines that an incident electron was present when the raw pixel signal is larger than the predetermined threshold value, whereas it is determined that no incident electron was present when the raw pixel signal is smaller than the predetermined threshold value. Such threshold detection however only shows a sufficient performance when the signal to noise ratio is sufficiently large to discriminate between noise (resulting in a raw pixel signal below the predetermined threshold) and the presence of an electron (resulting in a raw pixel signal above the predetermined threshold). However, when the dose is low, such threshold detection will not result in a satisfactory performance. Moreover, one incident electron will generate signals in a plurality of adjacent pixels in a semiconductor sensor, which may be characterized by a point spread function and which may be referred to as inter-symbol-interference (ISI). It is known to use deconvolution techniques to accommodate for such ISI, but known deconvolution techniques do not result in a satisfactory performance when the signal to noise ratio is very poor.

For one-dimensional signals corresponding to binary data as well as for two-dimensional signals corresponding to binary data, it is known to use a signal processing techniques known as Viterbi Detection. A Viterbi Detector performs maximum-likelihood detection in an efficient manner using a technique known as dynamic programming Hereto, the Viterbi Detector operates on a sequence of data samples. In data storage, this sequence corresponds to a sequence of data samples in the time domain, but in embodiments of the image reconstruction, the sequence corresponds to a sequence of adjacent pixels. Central to Viterbi Detection is the notion of states: a state corresponds to a possible configuration of the original data. An example will be given below. When considering the next data sample of the sequence, transitions are considered between the possible state(s) of the current data sample and the possible state(s) of the next data sample. A weight may be accorded to each transition to indicate the likelihood of such transition. The weight may be determined from evaluating the difference between the actual state of a pixel and a model of the state of the pixel. The model of the state of the pixel may e.g. be represented by a calculation of the pixel signal that would be obtained for the state using a model that models the contribution of the configuration of the original data corresponding to the state while ignoring noise, hereby obtaining a modelled pixel signal. The weight may then be determined as e.g. the absolute value of difference of the actual pixel signal and the modelled pixel signal. Such weight may be calculated between the actual pixel signal and a plurality of modelled signals, one for each state. For the state representing the actual configuration, the weight will substantially only be noise. For other states, the value will deviate more. In order to improve the performance, a Viterbi Detector does not decide on the basis comparing a single pixel with all possible states, but uses sequences of states instead. The number of successive states of a sequence is referred to as the path memory length. The path memory length is preferably between 2 and 5 times the length of the PSF, preferably between 3 and 4 times. A sequence of states comprises transitions between successive states, each with their respective weight. In such sequence, a weight relating one transition (from one data sample to the next) is referred to as 'branch metric'. The sum of all weights of a sequence of states is referred to as 'path metric'. The sequences of states and the transitions between successive states are referred to as a trellis diagram. Viterbi Detection relates to finding the path with the lowest path metric through the trellis diagram. A complete maximum likelihood detector would evaluate and keep track of all possible paths through the trellis diagram. The complexity of a Viterbi Detector is reduced by only keeping track of those paths that may result in the path with the lowest metric. Hereto, the Viterbi Detector determines for each state along the trellis which path(s) have the smallest path metric leading to that state along the trellis, and maintains those as 'survivor path(s)', while the other path(s) are discarded from further use.

Viterbi Detection has been developed for data storage and mobile communication. Hereby, Viterbi Detection can accommodate for inter-symbol-interference and noise, provided the characteristics of the system can be well modelled. Now, an example of Viterbi Detection of a known type is described. The example relates to an exemplary system with a binary input signal, i.e., with data values '0' or '1', and a point spread function PSF=(121) defining that each data value '1' results in relative signal contributions 1:2:1 in adjacent data samples, whereas data value '0' does not result a signal contribution. The system has white noise. Further, the system is characterized by a run-length constraint that there should be at least two '0's between two '1's.

Figure 2:
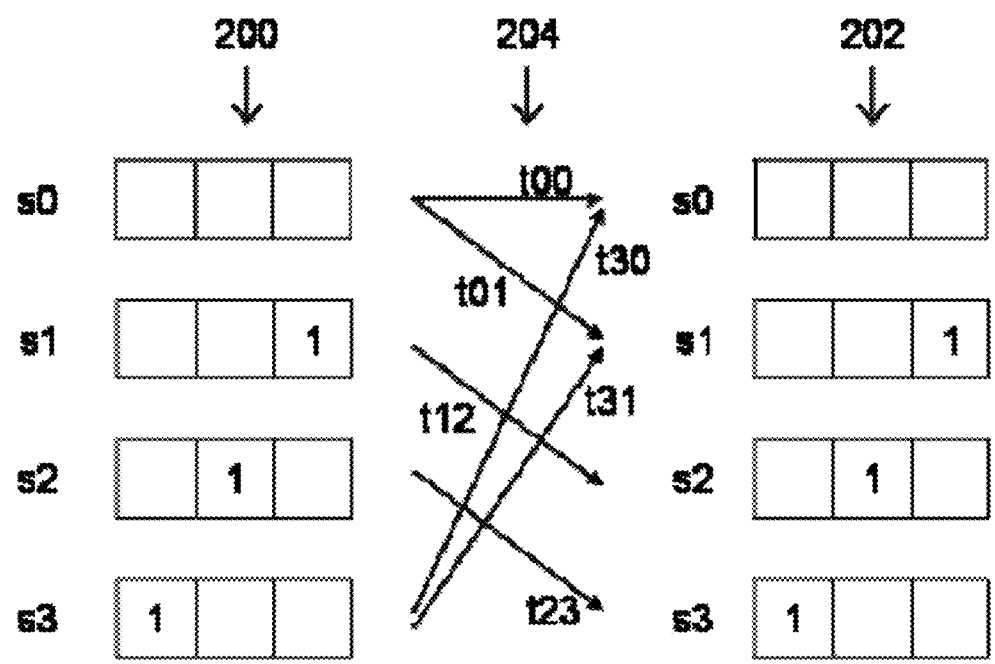
FIG. 2 shows an example of states and transitions of an exemplary Viterbi Detector.

FIG. 2 shows an example of states and transitions of such exemplary Viterbi Detector.

As shown in FIG. 2, the Viterbi Detector has a plurality 200 of states, consisting of one states, labelled s0, with three successive data values of '0', and three different states, labelled s1, s2 and s3, with one data value '1' and two data values '0'. The states s0, s1, s2 and s3 may also be referred to as '000', '001', '010' and '100'. FIG. 2 shows that the run-length constraint defines a plurality 204 of transitions from the plurality 200 of states to the next plurality of states 202: state s0 can only be followed by state s0 or s1 as shown by transitions t00 and t01, state s1 can only be followed by state s2 as shown by transition t12, state s2 can only be followed by state s3 as shown by transition t23, state s3 can only be followed by states s0 and s1 as shown by transitions t30 and t31.

Figure 3:
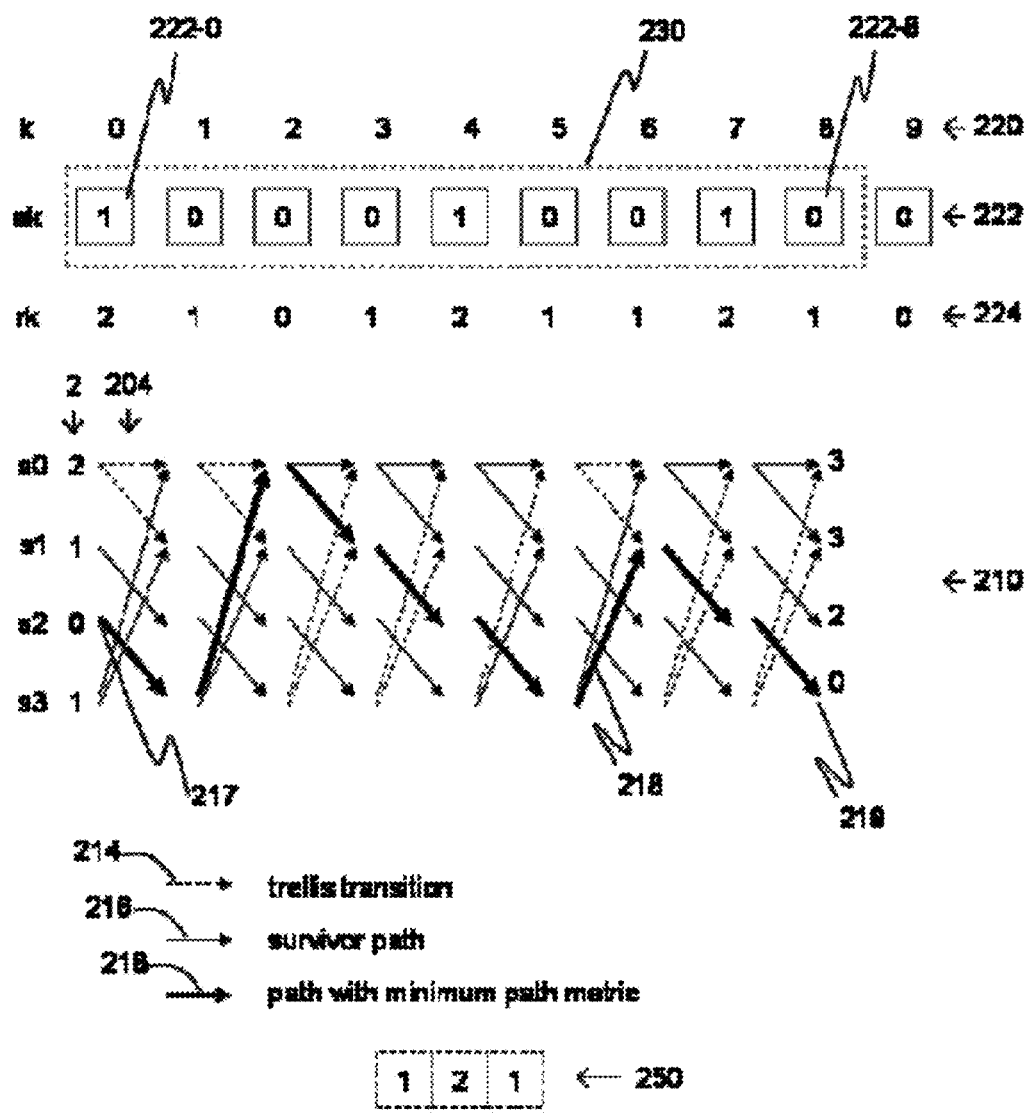
FIG. 3-FIG. 5 illustrate the operation of a Viterbi Detector.
Figure 4:
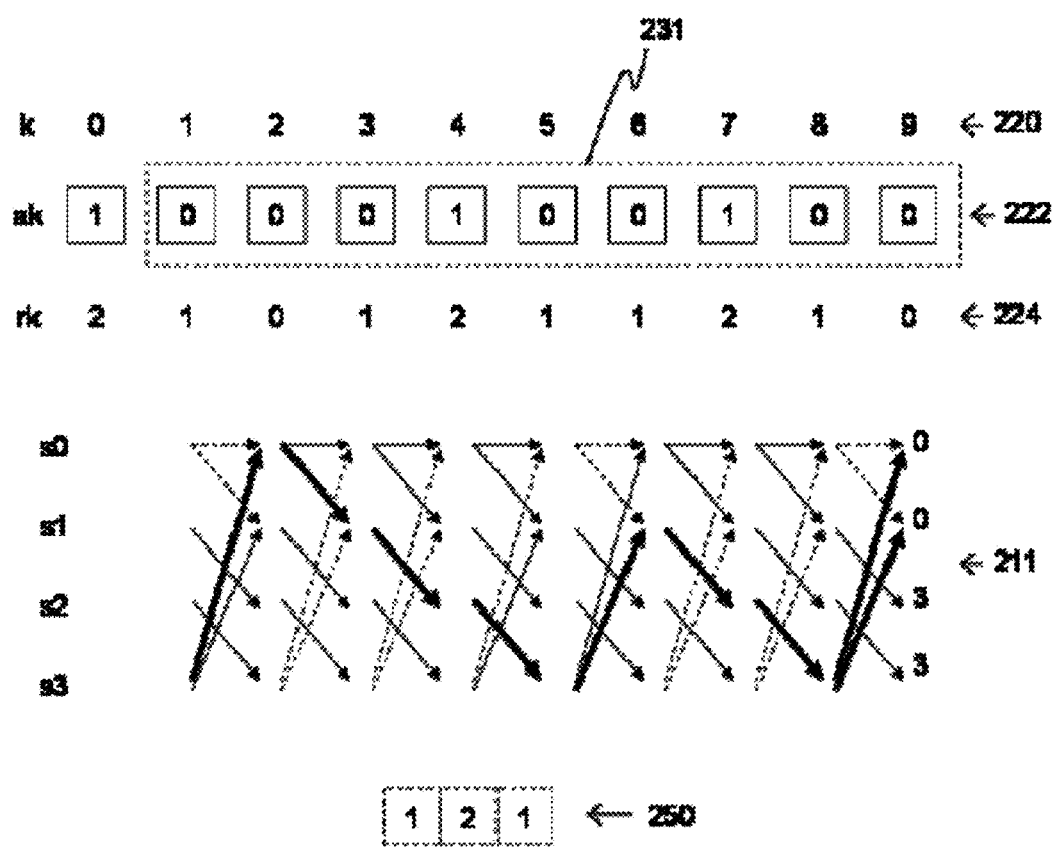

FIG. 3 and FIG. 4 illustrate the operation of the Viterbi Detector.

FIG. 3 shows a plurality of k=0, . . . , 9 successive input data values ak 222 of values '0' or '1' indicated in boxes. For k<0, all input data values are considered to be 0. FIG. 3 also shows the corresponding data samples rk 224. Dashed box 230 indicates the range of data samples that are being considered over a path memory length L for a first detection of the Viterbi Detector. Modelled, noiseless detector values xi may be obtained from convoluting the PSF=(121) with the input data values: for the center pixel of each state, states s0, s1, s2 and s3 thus correspond to modelled, noiseless detector values x0=0, x1=1, x2=2 and x3=1.

FIG. 3 also shows a trellis 210. The trellis 210 indicates all possible transitions between successive states. The trellis also indicates the survivor paths 216, i.e. the paths that have the lowest summed branch metrics for the successor state up along the trellis. As branch metric BM, the absolute difference between the modelled, noiseless detector value xi and the data sample rk is used, i.e.

$$BM = |xi - rk|.$$

The skilled person will appreciate that alternative branch metrics BM' may be used, such as e.g.:

$$BM'=(xi-rk)^2.$$

As an example, at k=0, the input data value is a0=1, noiseless detector values are x0=0, x1=1, x2=2 and x3=1, r0=2, so the branch metrics BM=|xi−rk| are: BM(s0)=2, BM(s1)=1, BM(S2)=0, BM(s3)=1. Thus, the survivor path leading to s0 as successor state is selected as the minimum from transition t00 and t30 with corresponding branch metrics 2 and 1: to reach s0 at k=1, only the path consisting of transition t30 from s3 is kept as candidate path, whereas the path from s0 is discarded. The other survivor paths leading to s1, s2 and d3 at k=1 are respectively t31 (the lowest BM of transitions t21 and t31), t12 (the only possible transition to s2) and t23 (the only possible transition to s3). Likewise are the survivor paths to states at k=2, . . . , 9 indicated in the trellis with full errors 216 and all discarded paths are discarded with dashed arrows 214.

The Viterbi Detector determines at k=8 which of all survivor paths along the path memory length has the lowest path metric. For the example shown, the path metrics at k=8 are 3, 3, 2 and 0 to states s0, s1, s2 and s3 respectively. Thus, the path leading to s3 is selected as the path with the maximum likelihood of representing the actual sequence of states. The Viterbi Detector traces back this path to its originating state at k=0, and finds state s2, i.e. '010' at k=0. The left-most value of this state, i.e. '0', is outputted as the output value for the previous position: the reconstructed output value for k=−1 thus equals '0'.

Then, the Viterbi Detector shifts to the next data sample to obtain the situation as shown in FIG. 4. Dashed box 231 indicates the range of data samples that are now being considered a second detection of the Viterbi Detector.

Trellis 211 of FIG. 4 corresponds to the trellis of 210, wherein the transitions from k=0 to k=1 are discarded and new branch metrics from k=8 to k=9 have been calculated and the trellis 211 is extended with the corresponding survivor paths. It may be observed that s0 and s1 both have a path metric of 0 at k=9. Both originate from s3 at k=1. So the Viterbi Detector finds states s3, i.e. '100' at k=1, and outputs a reconstructed output value for k=0 as '1'.

The Viterbi Detector may this continue until all output values have been determined When the right-most value of the range of data samples that are being considered is the last value of the sequence, the Viterbi Detector may output the complete path as outputs for the last 9 states. Alternatively, the Viterbi Detector may use ak=0 for subsequent data samples.

The above described Viterbi Detector may be very effective for systems wherein the model of the system is sufficiently accurate to model the noiseless detector value xi for each possible configuration of input data values ak, wherein at the same time a sufficient discrimination between a true input signal and noise can be obtained. Such and similar Viterbi Detectors may successfully be used to recover from the ISI for one-dimensional binary data with a significant amount of ISI, i.e. a point spread function of several data samples. Also, such and similar Viterbi Detectors may successfully be used to reconstruct two-dimensional binary data, such as Smart Codes used to for identification. For two-dimensional data, a Viterbi Detector may e.g. be used strip-wise, wherein Viterbi Detection is used along rows, and hard decisions are made from row to row or from strip to strip. However, the Viterbi Detector as described above does not work well with TEM images.

Figure 5:
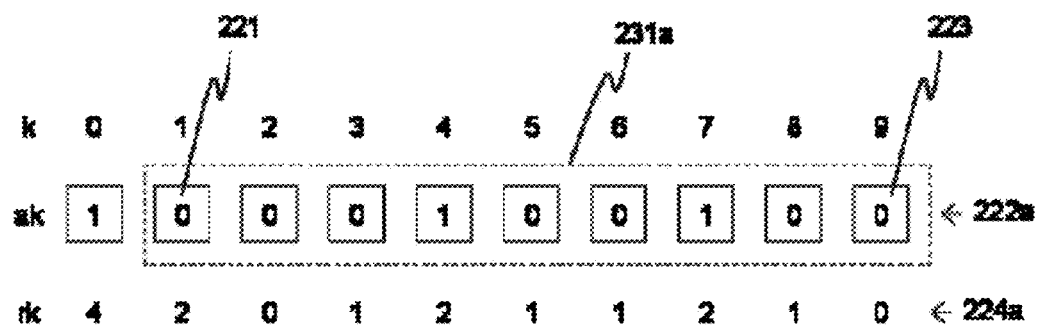
Figure 5:
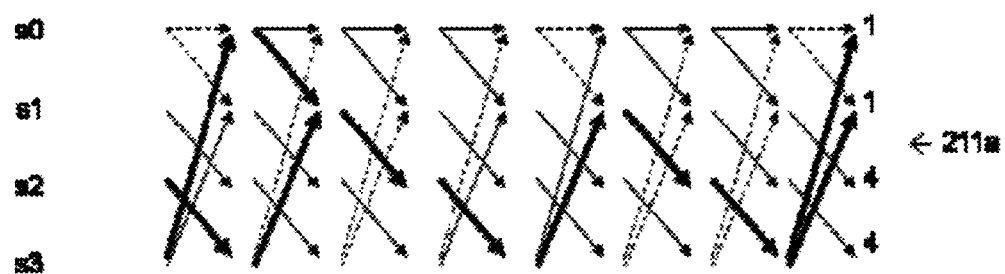

FIG. 5 illustrates the performance of the above described Viterbi Detector for an exemplary one-dimensional TEM image. The Viterbi Detector uses the same states and same transitions as the Viterbi Detector described with reference to FIGS. 3 and 4. In these states and their branch metrics, the modelled signal level is defined as the peak signal level Epeak of the distribution of signal levels resulting from a single incident electron. The model hereby uses the knowledge that an incident electron of 300 keV may result in any number of electron hole pairs between 0 and 80.000 and a corresponding distribution of detected charge, with a distribution that is similar to a Landau-function, i.e., strongly peaked at the signal level Epeak. The k=0, . . . , 9 successive input data values ak 222 of values '0' or '1' indicate the absence or presence of an electron on the corresponding pixel and is indicated in the boxes. FIG. 5 also shows the corresponding data samples rk 224a, which are equal to the values from FIG. 3, except for r0 and r1 relating to positions k=0 and k=1. The inventor believes that the different values for r0 and r1 originate from an electron having resulted in a significantly larger amount of charge in the sensor than the amount of charge corresponding to Epeak. For this exemplary situation, the trellis and the paths with minimum path metric are indicated FIG. 5. It is observed that two paths with the same minimum path metric are obtained: one originating from s2 and the other from s3. For the Viterbi Detector, both paths have an equal likelihood. The Viterbi Detector may thus output either a '0' according to state s2, or a '1' according to state. However, the correct output is '1' as there is a single electron at k=0. The Viterbi Detector may thus erroneously output '0'.

Figure 6:
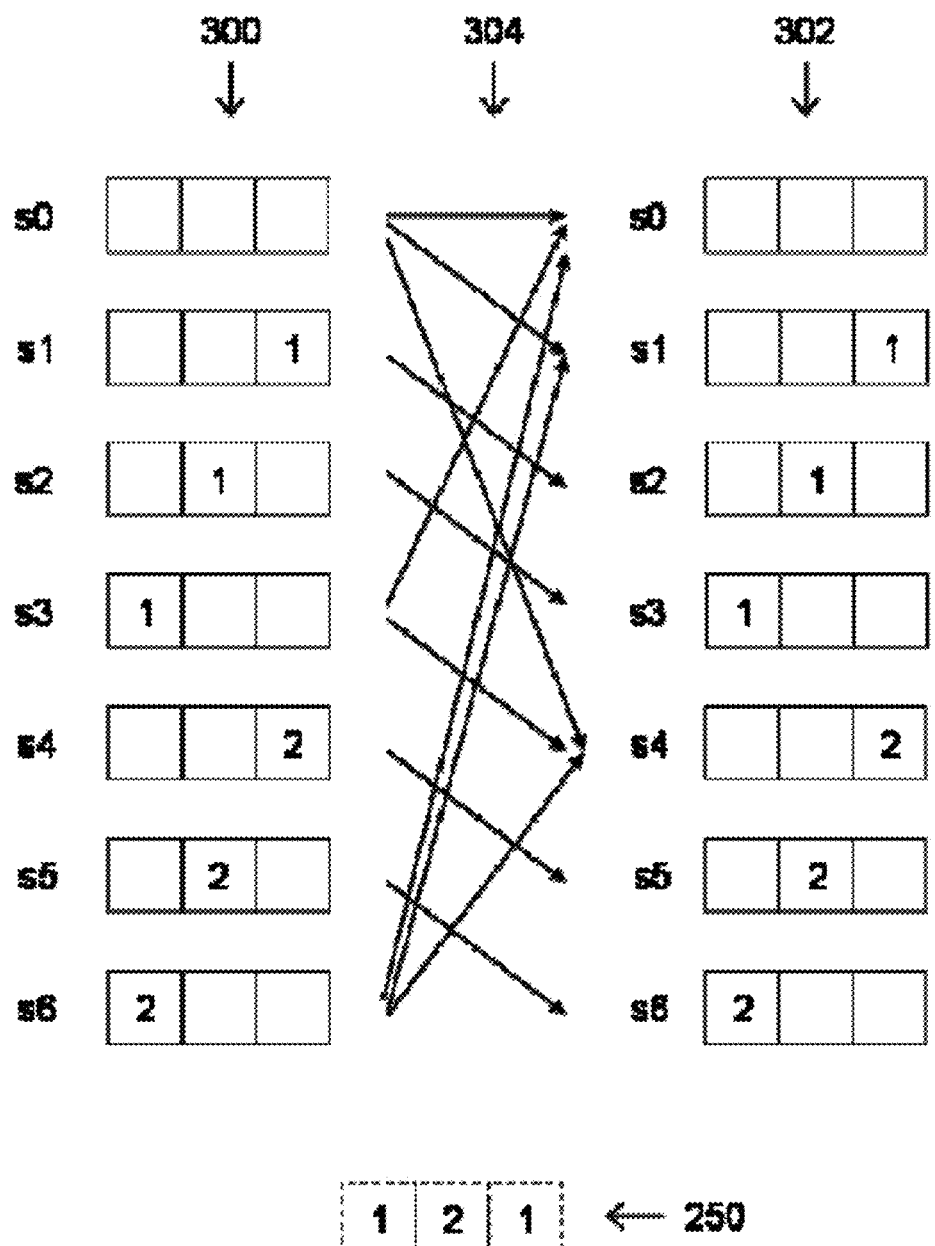
FIG. 6 shows an example of states and transitions for use with a Viterbi Detector in an embodiment of the invention.

FIG. 6 shows an example of states and transitions for use with a Viterbi Detector in an embodiment of the invention.

As shown in FIG. 6, the Viterbi Detector has a plurality 300 of states, consisting of one states, labelled s0, with three successive data values of '0', three different states, labelled s1, s2 and s3, each having one data value '1' and two data values '0' and three different states, labelled s4, s5 and s6, each having one data value '2' and two data values '0'. FIG. 6 also shows all allowable transitions 304, allowing to define the full trellis diagram.

Figure 7:
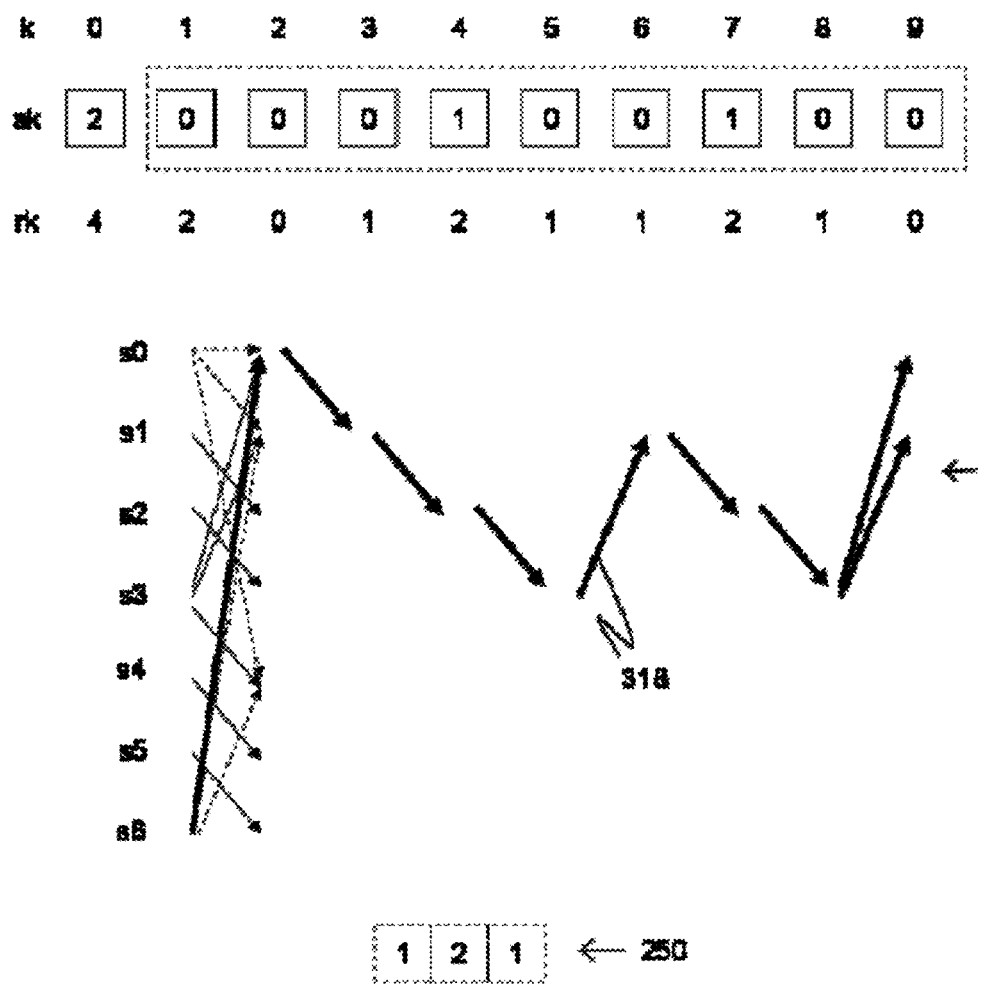
FIG. 7 illustrates the operation of the Viterbi Detector of FIG. 6.

In a first embodiment, the numerical value indicated in the boxes in FIG. 6 indicates the number of electrons incident on a single pixel. Compared to FIG. 2, it may thus be seen that the states are extended with states wherein more than one electron is incident on the same pixel, i.e. states s4, s5 and s6. According to this embodiment, a new trellis is constructed and a corresponding Viterbi Detector will obtain state s6='200' at k=1 as resulting in the minimum path metric: the trellis is shown in FIG. 7. The Viterbi Detector will thus output '2' as a result, indicative of the presence of two electrons on the corresponding pixel. After having obtained the output from the Viterbi Detector, the method according to the first embodiment analyses the output from the Viterbi Detector and adjusts all non-zero output values to '1'. Hereby, assuming a low coincidence rate of two electrons on a single pixel, the most likely multiplicity of electrons per pixel, i.e. just one instead of two, may be used as the output of the method. Thus, in this first embodiment, a plurality of different states of the Viterbi Decoder relates to the same multiplicity (in this case, one) of incident electrons as output of the method, the different states being modelled using a different multiplicity of electrons. It will be appreciated that, for a low dose, e.g. of 0.01 electron per pixel, and with the reference level suitable selected, the frequency of occurrence of two electrons on a single pixel may significantly smaller, e.g. an order of magnitude smaller, than the frequency of occurrence of a single electron with a double deposited energy.

In a second embodiment, the numerical value indicated in the boxes in FIG. 6 indicates an energy bin accorded to a single electron incident on a single pixel. Compared to FIG. 2, it may thus be seen that the states are extended with states wherein a single electron is incident on the same pixel, but of a different typical energy, i.e. states s4, s5 and s6. According to this embodiment, a new trellis is constructed and a corresponding Viterbi Detector will obtain state s6='200' at k=1 as resulting in the minimum path metric: the trellis is shown in FIG. 7. The Viterbi Detector will thus output '2' as a result, indicative of the presence of a single electron of energy bin '2' on the corresponding pixel. Thus, in this second embodiment, a plurality of different states of the Viterbi Decoder relates to the same multiplicity of incident electrons (in this case, one) as output of the method, the different states being modelled using different deposited energies of the electron(s).

In another embodiment, the different states are modelled using different point spread functions in modelling deposited energies of the particle(s). The different point spread functions may e.g. have different amplitudes, thereby modelling different deposited energies of the electron(s).

Figure 8:
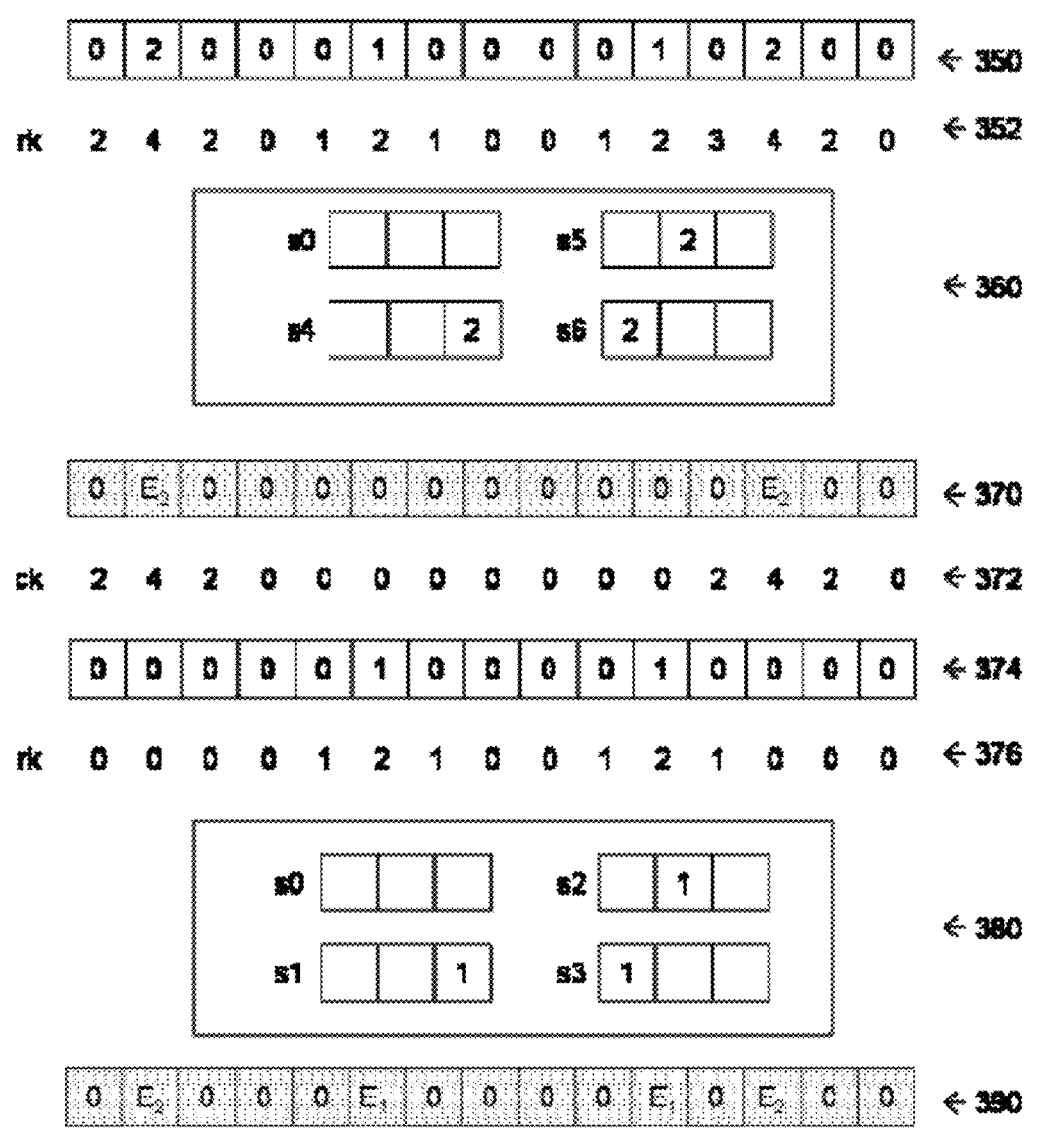

FIG. 8 illustrates a third embodiment using the same states as shown in FIG. 6. In the third embodiment, the Viterbi Decoder operates in a plurality of iterations. In each iteration, state s0 is used together with a plurality of different states, each of the plurality of different states having one data value of a specific data value (with the same specific data value for all three states) and two data values '0', where the data values of the specific data value are located at different positions for each of the different state. The third embodiment is illustrated using an example shown in FIG. 8. The example shows a configuration of electrons labelled with their deposited energy bin '0', '1' or '2' in row 350, and with corresponding data samples 352. In the example shown, the Viterbi Decoder operates in a first iteration with a first plurality 360 of states s0, s4, s5 and s6. States s4, s5 and s6 may be defined similarly to those in the first embodiment, or, alternatively, to those in the second embodiment. In the first iteration, the Viterbi Decoder will thus effectively only reconstruct electrons with an energy corresponding to that of states s4, s5 and s6, but not to that of states s1, s2 and s3. The number of states is thus reduced to 4 and the number of transitions to 6, whereby trellis is significantly simplified compared to the trellis associated with the first and second embodiments. The Viterbi decoder outputs from this first iteration, for the example shown, two electrons indicated with $E_2$ on 370, which correspond to data values as shown in 372. The data values 372 corresponding to the found electrons are then subtracted from the corresponding original data values 352, to result in residue data values 376. The residue data values 376 are then used as input to a second iteration of the Viterbi Decoder with a second plurality 380 of states s0, s1, s2 and s3. The Viterbi decoder outputs from this second iteration, for the example shown, two electrons indicated with $E_1$ on 390. The outputs of the first and second iteration are then added to result in the complete output shown as 390: all 4 electrons, two of a deposited energy around E2 and one of a deposited energy around E1, have been reconstructed. Thus, in this third embodiment, a plurality of different states of the Viterbi Decoder relates to the same multiplicity of incident electrons (in this case, one) as output of the method, the different states being used in different iterations of the Viterbi Decoder.

Figure 9:
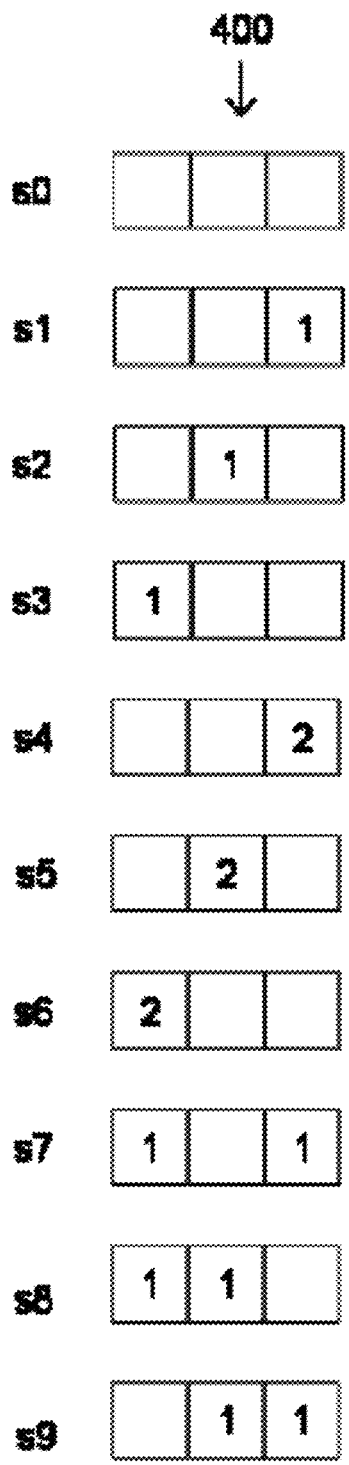

FIG. 9 shows the states of a fourth embodiment. The fourth embodiment comprises the same states as the first embodiment, as well as three additional different states s7, s8 and s9, each having two data values '2' and one data values '0'. States s0-s9 thus define 10 different states having 0, 1 or 2 electrons. As in the first embodiment, after having obtained the output from the Viterbi Detector, the method according to the fourth embodiment analyses the output from the Viterbi Detector and adjusts all non-zero output values to '1'. Hereby, assuming a low coincidence rate of two electrons on a single pixel, the most likely multiplicity of electrons per pixel, i.e. just one instead of two, may be used as the output of the method. Thus, in this fourth embodiment, a plurality of different states of the Viterbi Decoder relates to the same multiplicity (in this case, one) of incident electrons as output of the method, the different states being modelled using a different multiplicity of electrons on a single pixel. An advantage of the fourth embodiment may be that a larger dose can be accommodated, at the cost of more states, resulting in a larger memory requirement and a larger computational load.

It will be appreciated that the invention is not limited to the exemplary embodiments described above, but also includes e.g. other PSFs and other multiplicities of electrons than two or a larger number of energy bins than two.

The embodiments described above used one-dimensional data sequences. The embodiments may be extended to two-dimensional data sequences, such obtained from a two-dimensional array of pixels e.g. as described in the following.

Figure 10:
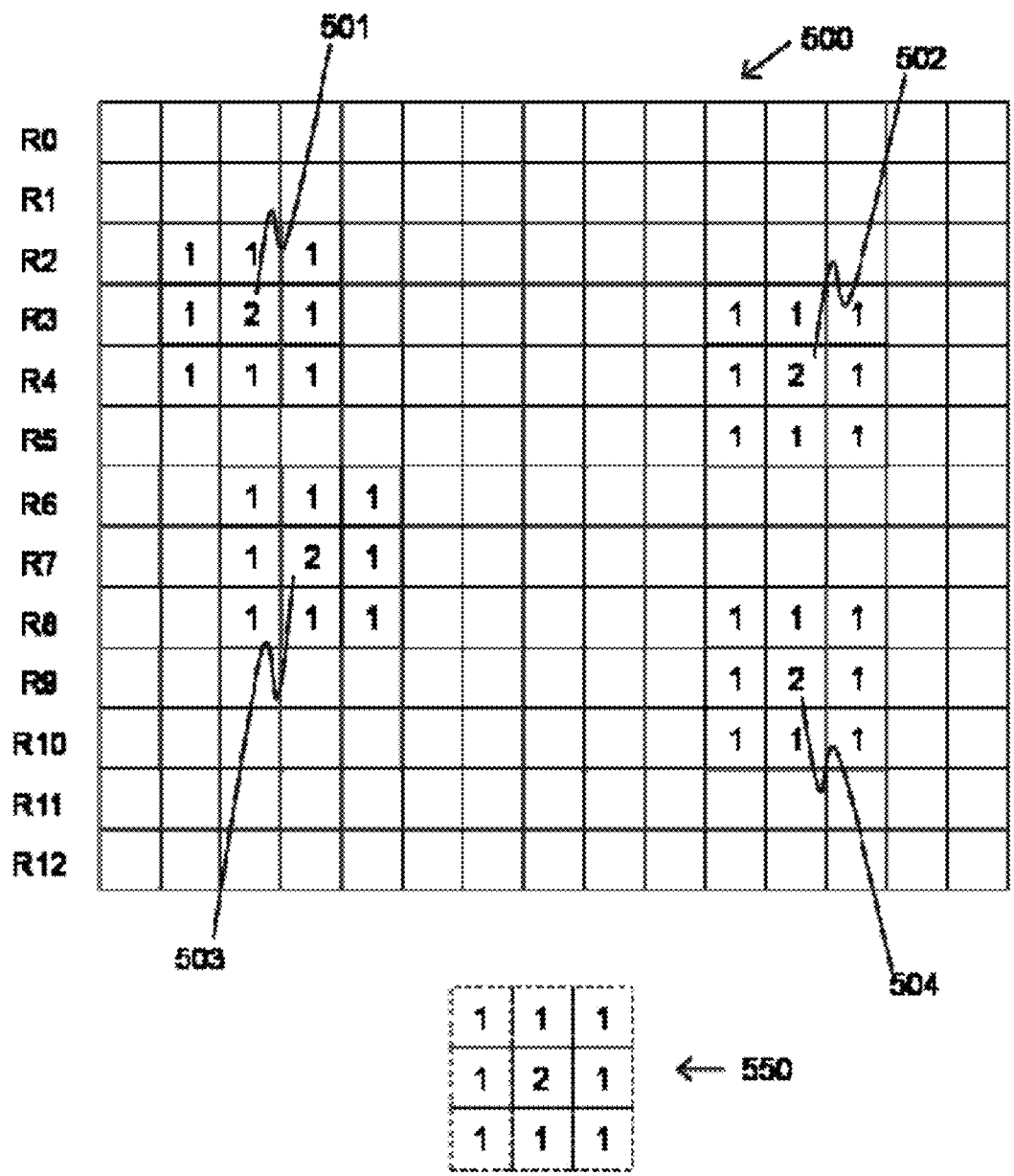
FIG. 10 schematically shows a two-dimensional semiconductor sensor.

FIG. 10 schematically shows a two-dimensional semiconductor sensor of a plurality of pixels arranged in a matrix 500, organized in a plurality of columns (of which 15 are shown; not numbered) and a plurality of rows of which rows numbered R0-R12 are shown. Four electrons are incident on the sensor, resulting in four regions on 3×3 pixels, denoted by 501, 502, 503 and 504. The electron hole pairs generated by each of the electrons diffuses to generate charge with a distribution according to a two-dimensional Point Spread Function $PSF2=(121)^2$. The numbers 1 and 2 in areas 501-504 thus indicate the relative contribution of an electron incident on the center pixel of the respective area to all surrounding pixels.

Figure 11:
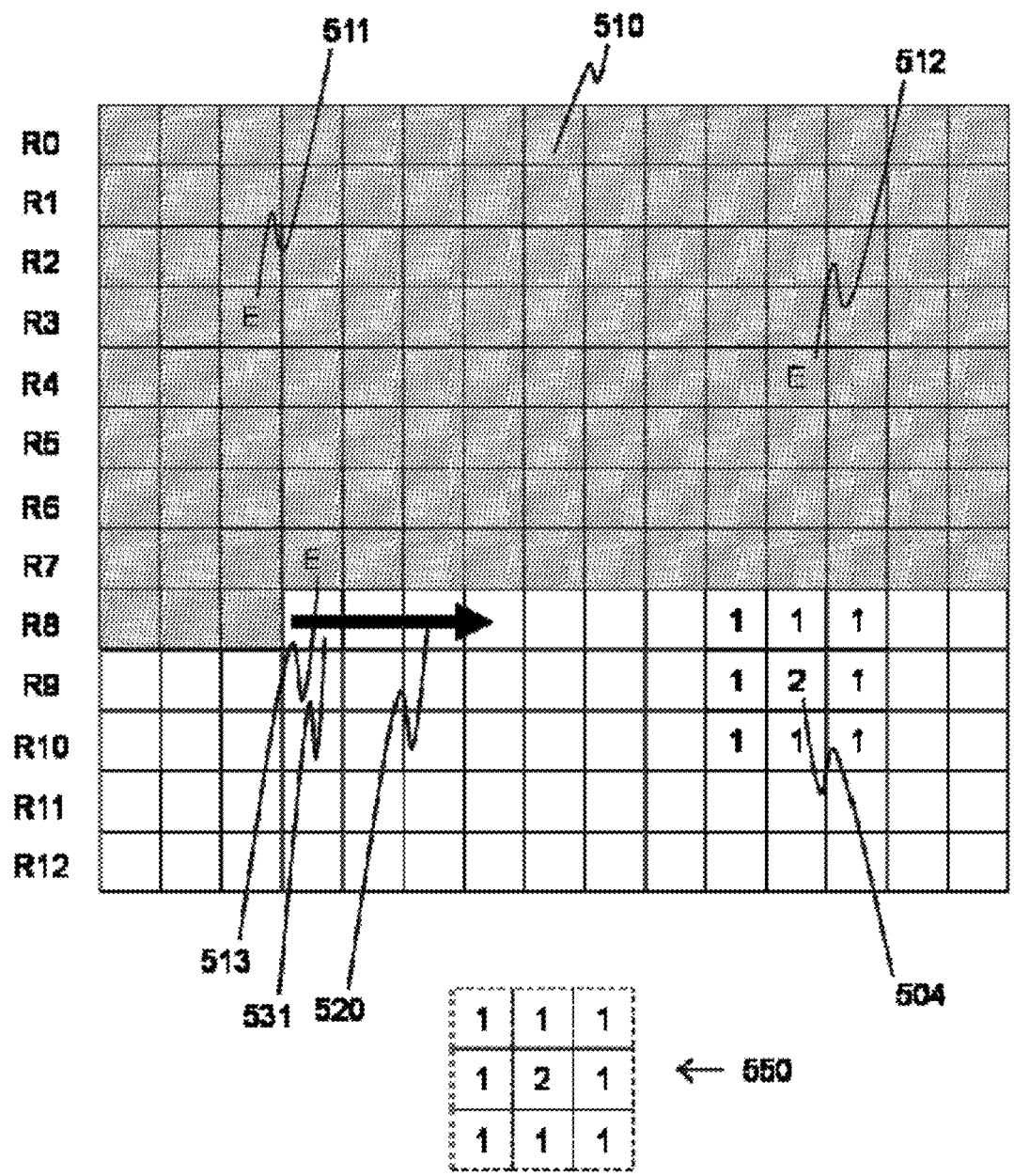
FIG. 11-FIG. 12 schematically illustrate the operation of a two-dimensional according to an embodiment.
Figure 12:
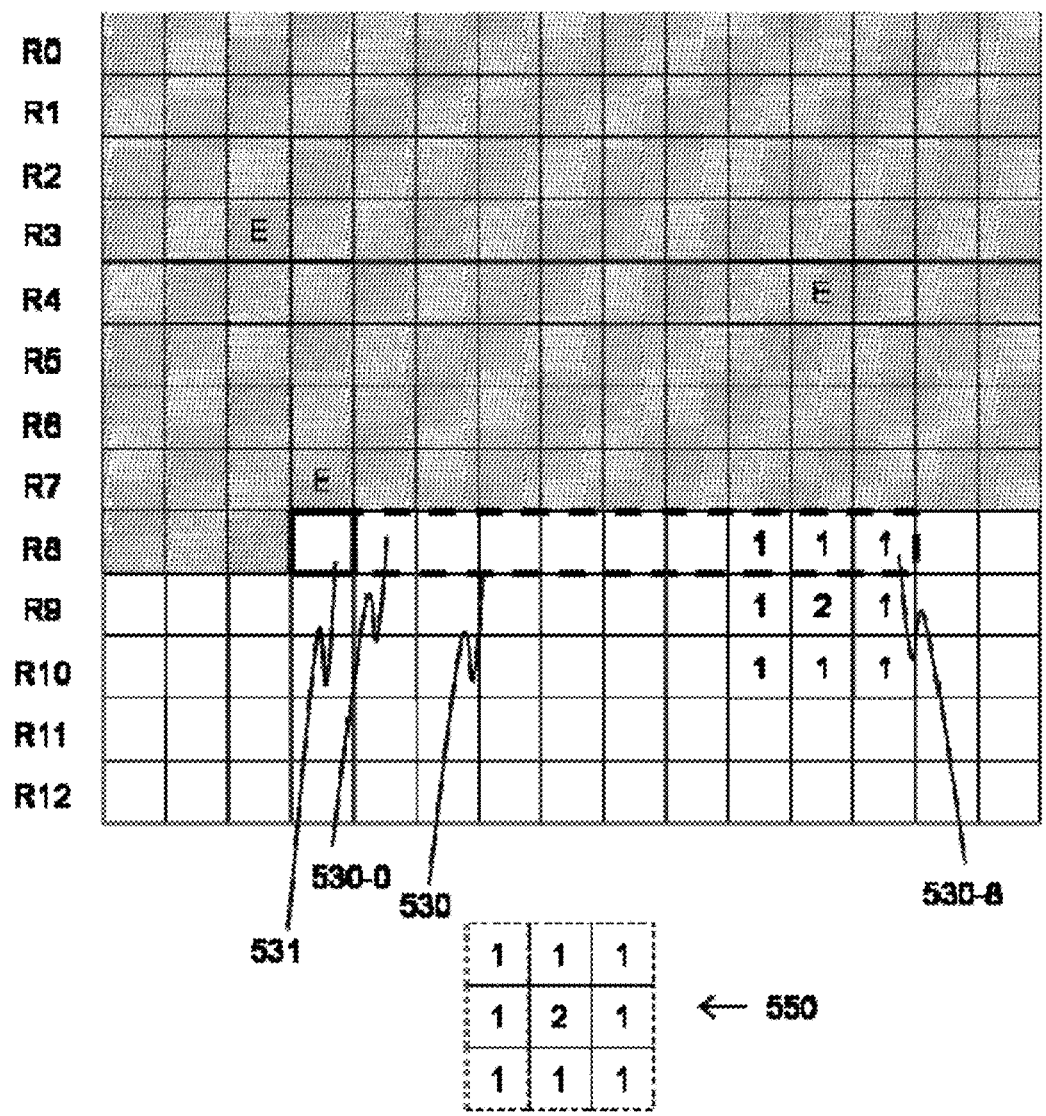
Figure 13:
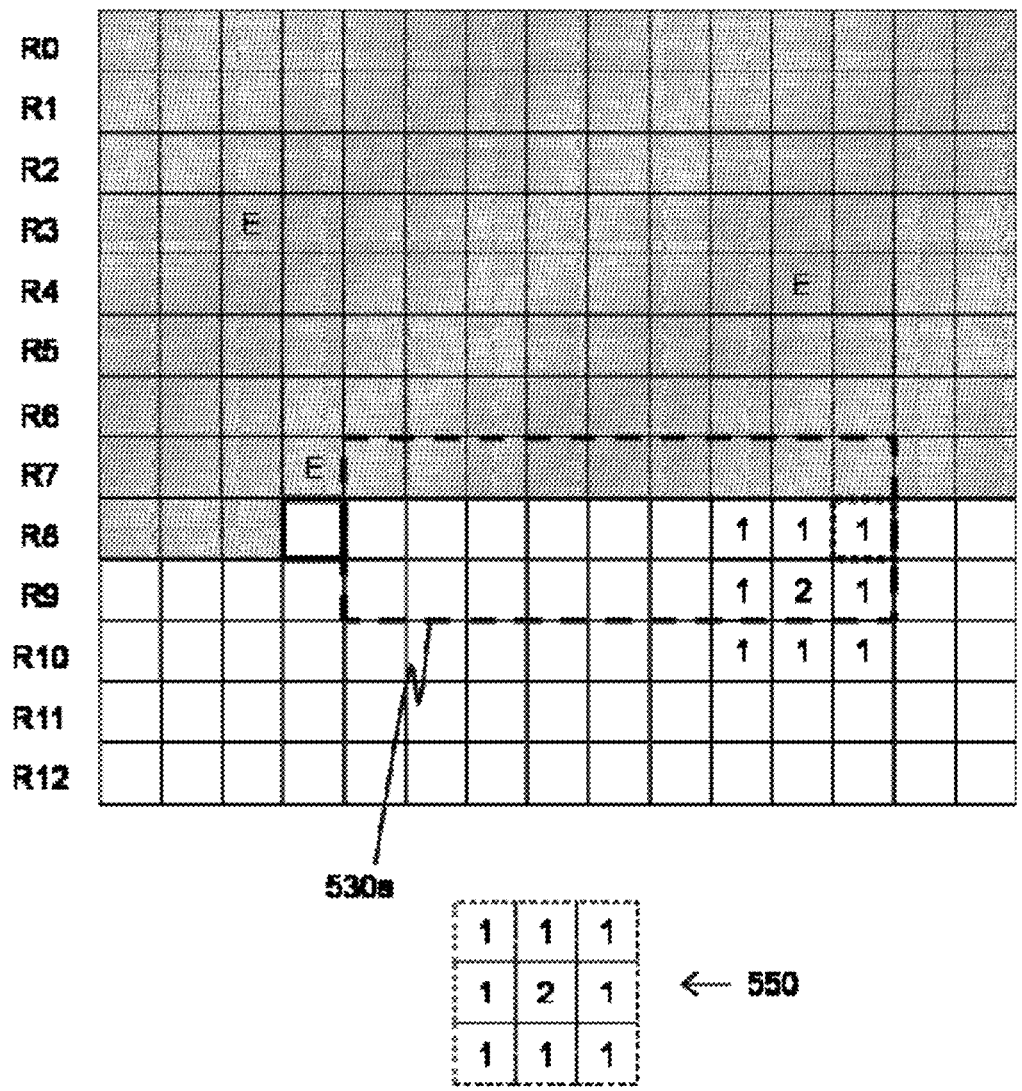
FIG. 13 schematically illustrates another embodiment.

FIG. 10-FIG. 12 schematically illustrate the operation of a two-dimensional method using Viterbi Detection according to a further embodiment of the invention.

Along a row, the Viterbi Detector operates analogously to that described above for a one-dimensional sequence of data samples: the adjacent pixels on a row for the one-dimensional sequence of data samples which are processed sequentially, in a direction indicated with arrow 520. Hashed area 510 in FIG. 11 and FIG. 12 indicated the area where detection has been completed. A first electron 511 corresponding to 3×3 region 501, a second electron 512 corresponding to 3×3 region 502 and a third electron 513 corresponding to 3×3 region 503 have been detected. Preferably, the (modelled) contributions to the pixel signals in the corresponding 3×3 regions has been subtracted from the data samples in the 3×3 regions. Hereby, their contribution to the data samples used for further detection has been deleted. No further electrons are detected in the rest of area 510. The method has proceeded to decide on the value of pixel 531. Hereto, the Viterbi Detector analyses the trellis, its branch metrics and states for the sequence of pixels in area 530, extending over a path memory length L from the pixel indicated with 530-0 to the pixel indicated with 530-8. In an embodiment, the Viterbi Detector calculates the branch metric for a state using a predetermined area around a respective pixel of pixels 530-0 to 530-8. The size of the predetermined are corresponds preferably substantially to the PSF. Hereby, all contributions of electrons at positions in the predetermined area to the respective pixel are summed and model the total pixel signal according to the state. The Viterbi Detector may e.g. use the plurality of states shown in FIG. 14 or FIG. 15.

In the embodiment described with reference to FIG. 12, the Viterbi Detector operates row-wise, i.e. the Viterbi Detection is applied to sequences of pixel signals per row of pixels of the two-dimensional array. In another embodiment, the Viterbi Detector operates column-wise, i.e., the Viterbi Detection is applied to sequences of pixel signals per column of pixels of the two-dimensional array.

Figure 14:
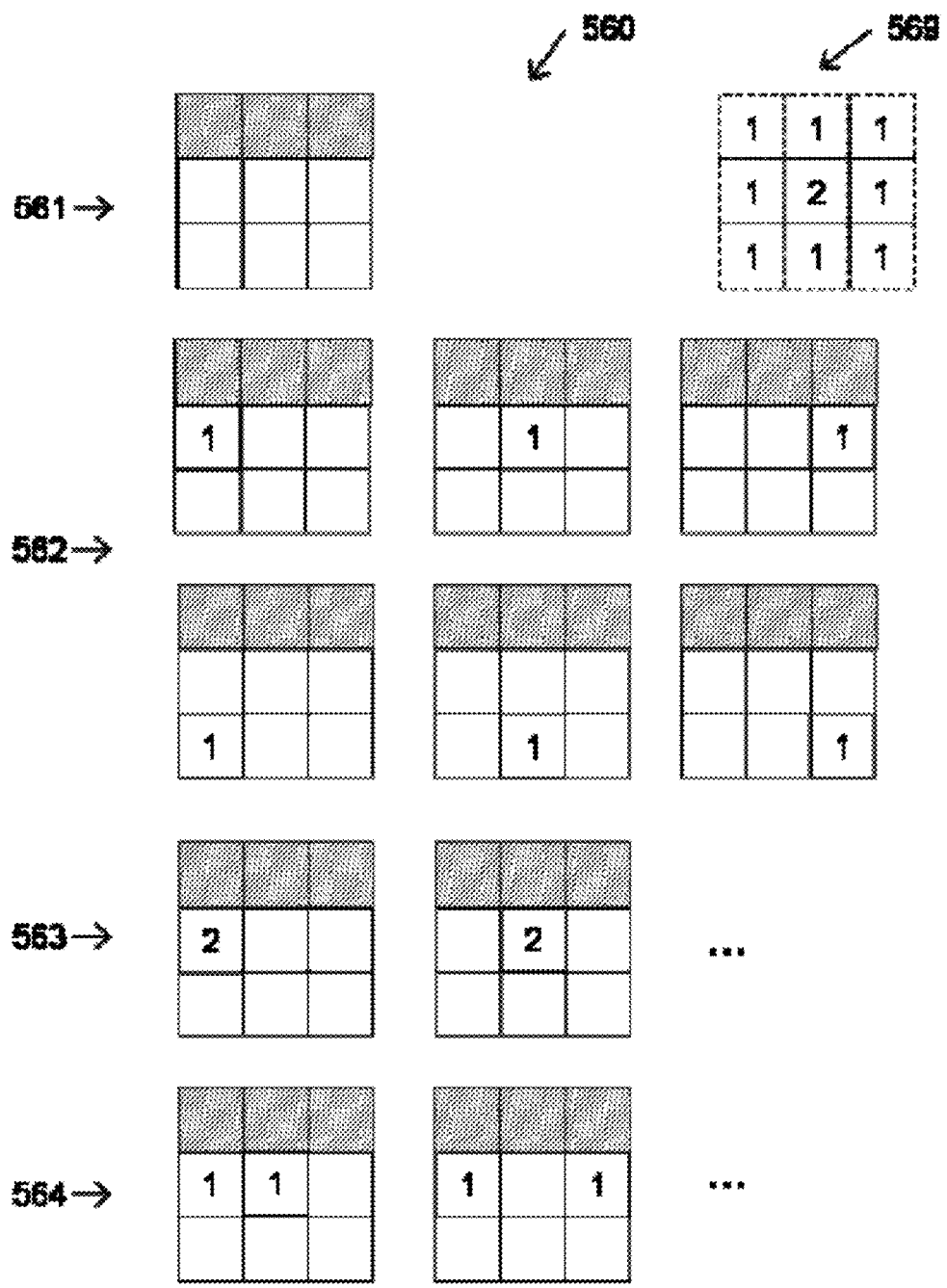
FIG. 14-FIG. 15 illustrate examples of states for use with other embodiments.
Figure 15:
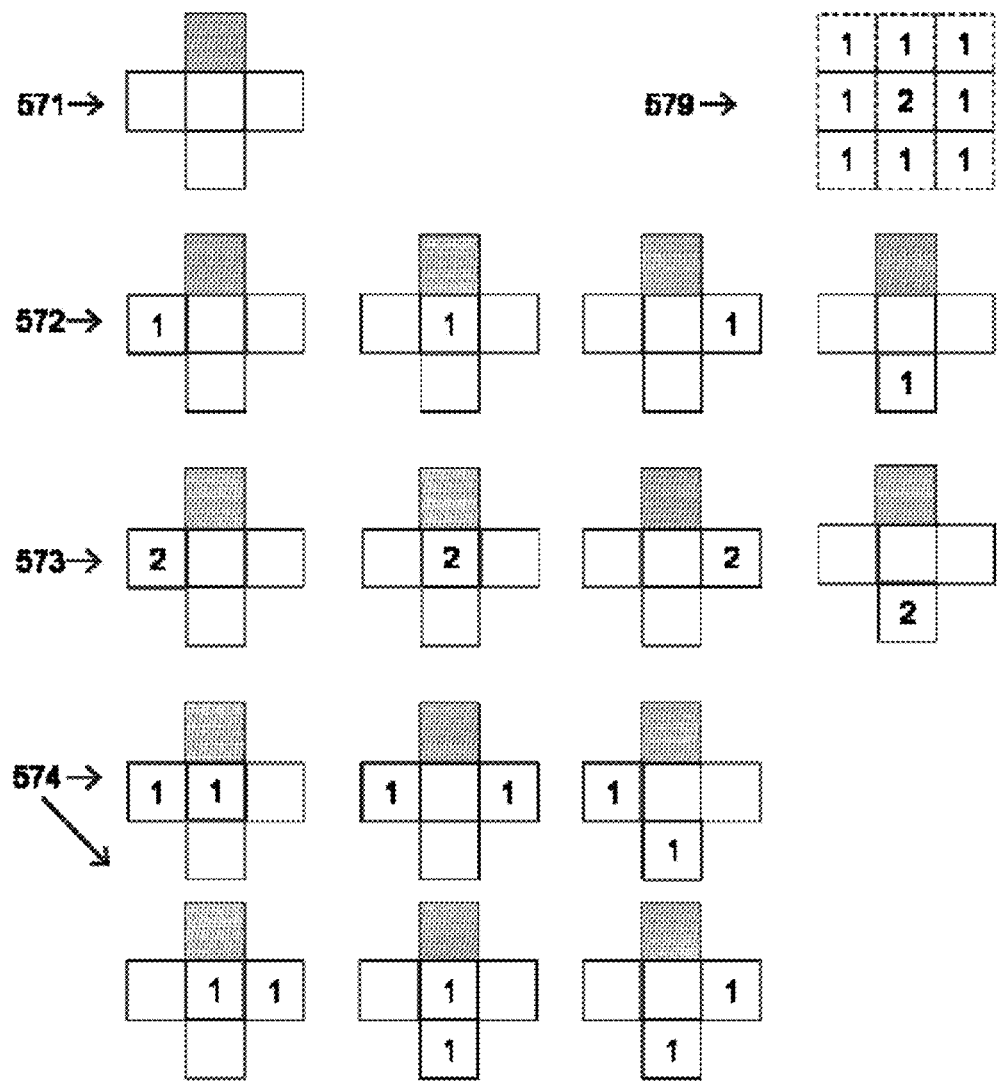

FIG. 14 schematically shows a plurality 560 of states used in a first further embodiment using a PSF=(121)², indicating the configuration of electrons incident on a 3×3 area of the sensor. FIG. 15 schematically shows another plurality 580 of states used in a second further embodiment. It is noted that the hashed area, corresponding to the pixels for which the Viterbi Detector has already taken a decision, may comprise an electron, but as its contribution has already been subtracted in the hashed as well as the non-hashed area (see above), such presence can be disregarded without any loss of generality. It will be understood that, when such contributions have not been subtracted while an electron has been detected, its contribution to the center pixel of the state will also have to be considered. However, as the decision on its presence has already been taken, it is not necessary to also consider the hashed positions as variable in the state definition.

FIG. 14 relates to a first further embodiment wherein a PSF is used on a 3×3 area. The PSF is shown in dashed form with reference number 569. The plurality of states 560 of FIG. 14 comprises one state 561 without any electrons; six different states 562 with one electron, on six different positions; six states 563 with two electrons on a single position within a state (or one double energy electron, cf. the first and second embodiment of the one-dimensional examples given above) but different between states; and, optionally, fifteen different states 564 with two electrons at different positions.

FIG. 15 relates to a second further embodiment wherein the same PSF=(121)² is used, but the states are defined based on a cross-shaped area of 1+3+1 pixels. The PSF is shown in dashed form with reference number 579. The plurality of states 580 of FIG. 15 comprises one state 571 without any electrons; four different states 582 with one electron, on four different positions; four states 584 with two electrons on a single position within a state (or one double energy electron, cf. the first and second embodiment of the one-dimensional examples given above) but different between states; and, optionally, six different states 574 with two electrons at different positions.

A Viterbi Decoder may use the states of FIG. 14 or FIG. 15 depending on the dose, allowed or required computational complexity and memory requirements etc.

It will be appreciated that, similarly to the third embodiment described with reference to FIG. 9, the Viterbi Decoder may also for the two-dimensional PSF, employ a plurality of iterations using a different multiplicity of electrons, or a different energy bin, per iteration.

Figure 16:
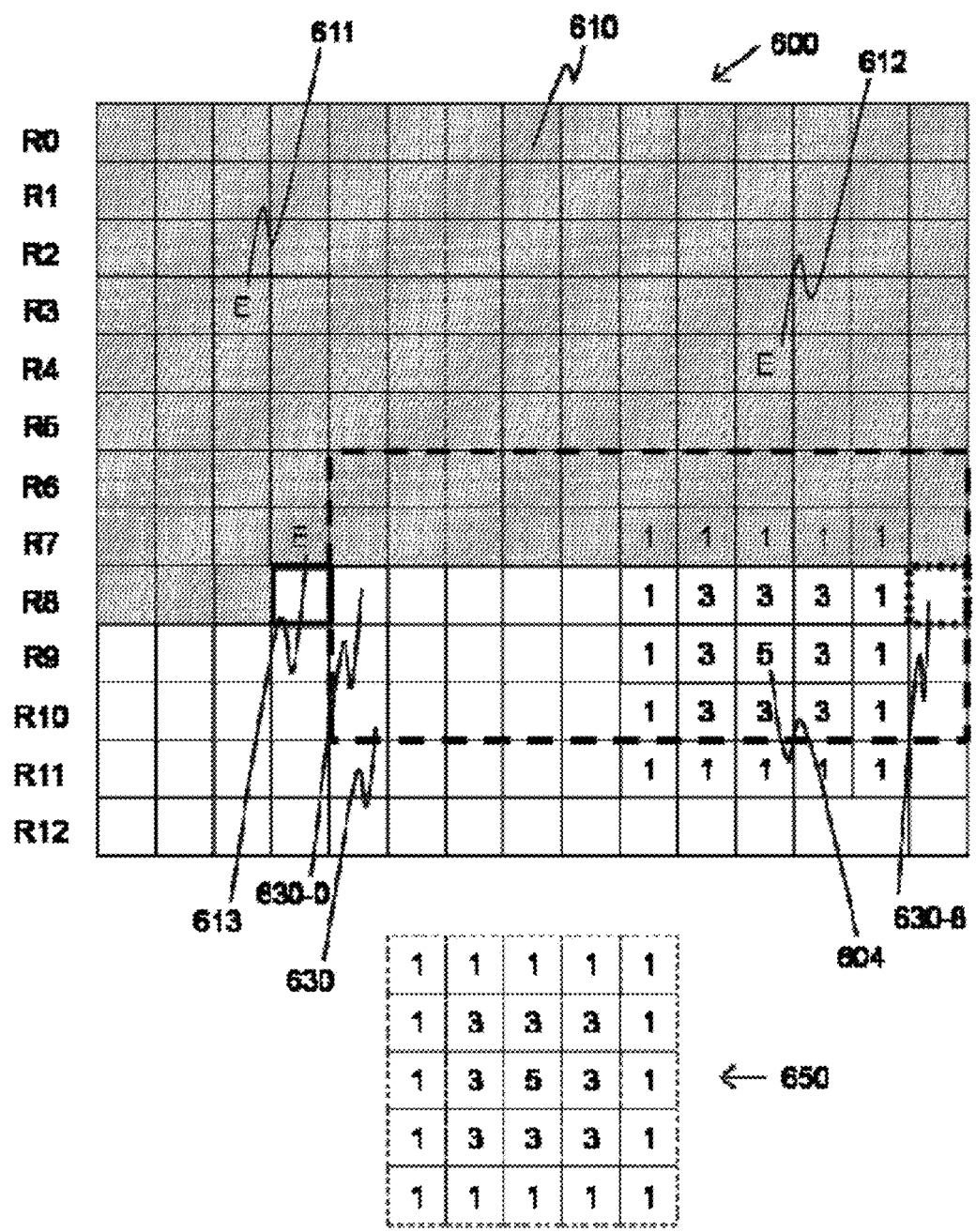
FIG. 16-FIG. 17 schematically illustrate another embodiment.
Figure 17:
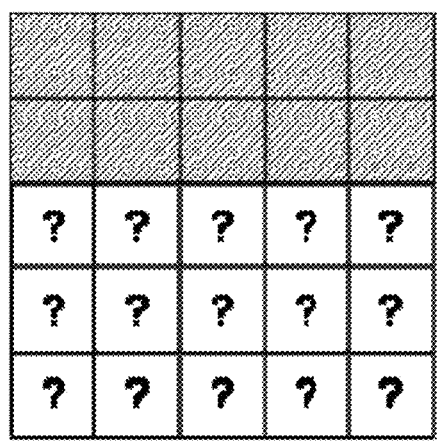
Figure 17:
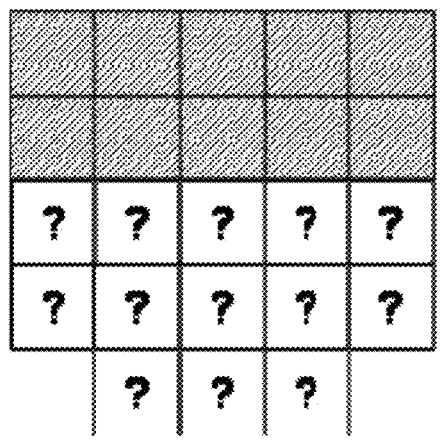
Figure 17:
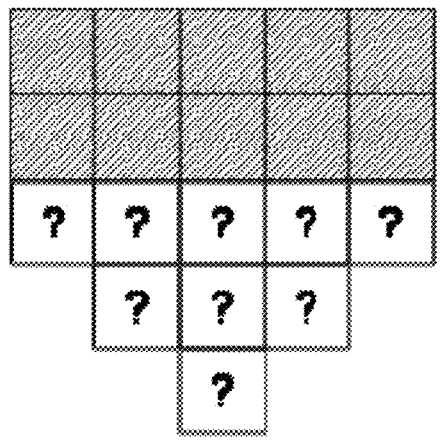

FIG. 16-FIG. 17 schematically illustrate the operation of a two-dimensional method using Viterbi Detection according to again a further embodiment of the invention, similarly to the embodiments of FIG. 10-FIG. 15, but with a wider Point Spread Function.

FIG. 16 schematically shows a two-dimensional semiconductor sensor of a plurality of pixels arranged in a matrix 600, organized in a plurality of columns (of which 15 are shown; not numbered) and a plurality of rows of which rows numbered R0-R12 are shown. Four electrons are incident on the sensor, resulting in four regions on 5×5 pixels, denoted by 601, 602, 603 and 604. The electron hole pairs generated by each of the electrons diffuses to generate charge with a distribution according to a two-dimensional Point Spread Function PSF3=(13531)². This PSF closely resembles the actual diffusion in an exemplary CMOS sensor having 4 k×4 k pixels of approximately 15 μm×15 μm size and a thickness of its active layer of 15 μm. Hashed area 610 indicates the area where detection has been completed. Three electrons 611, 612, 613 have already been detected.

The method has proceeded to decide on the value of pixel 631. Hereto, the Viterbi Detector analyses the trellis, its branch metrics and states for the sequence of pixels in area 630, extending over a path memory length L from the pixel indicated with 630-0 to the pixel indicated with 630-8. In an embodiment, the Viterbi Detector calculates the branch metric for a state using a predetermined area around a respective pixel of pixels 630-0 to 630-8. The size of the predetermined are corresponds preferably substantially to the PSF. Hereby, all contributions of electrons at positions in the predetermined area to the respective pixel are summed and model the total pixel signal according to the state. The Viterbi Detector may e.g. use one of the embodiments of the plurality of states shown in FIG. 17. The numbers 1, 3 and 5 in area 604 indicate the relative contribution of an electron incident on the center pixel of area 604 to all surrounding pixels.

FIG. 17 schematically three different embodiments defining the states of the Viterbi Detector, wherein question marks indicate the positions within an area around a pixel of the sequence of pixels used to determine the branch metrics upon which an electron may be incident. As in FIG. 14, the hashed area corresponds to the pixels for which the Viterbi Detector has already taken a decision (when scanning a previous row or earlier on the same row). The number of states increases with the total number of allowable electrons and with the number of allowable positions for an electron. A larger number of allowable electrons and/or a larger number of positions may however be preferred with increasing dose.

Embodiment 661 schematically indicates states having one, or in further embodiments more than one, of fifteen different positions which may have zero, one or a plurality of electrons. Embodiment 662 schematically indicates states having one, or in further embodiments more than one, of thirteen different positions which may have zero, one or a plurality of electrons. Embodiment 663 schematically indicates states having one, or in further embodiments more than one, of nine different positions which may have zero, one or a plurality of electrons.

Figure 18A:
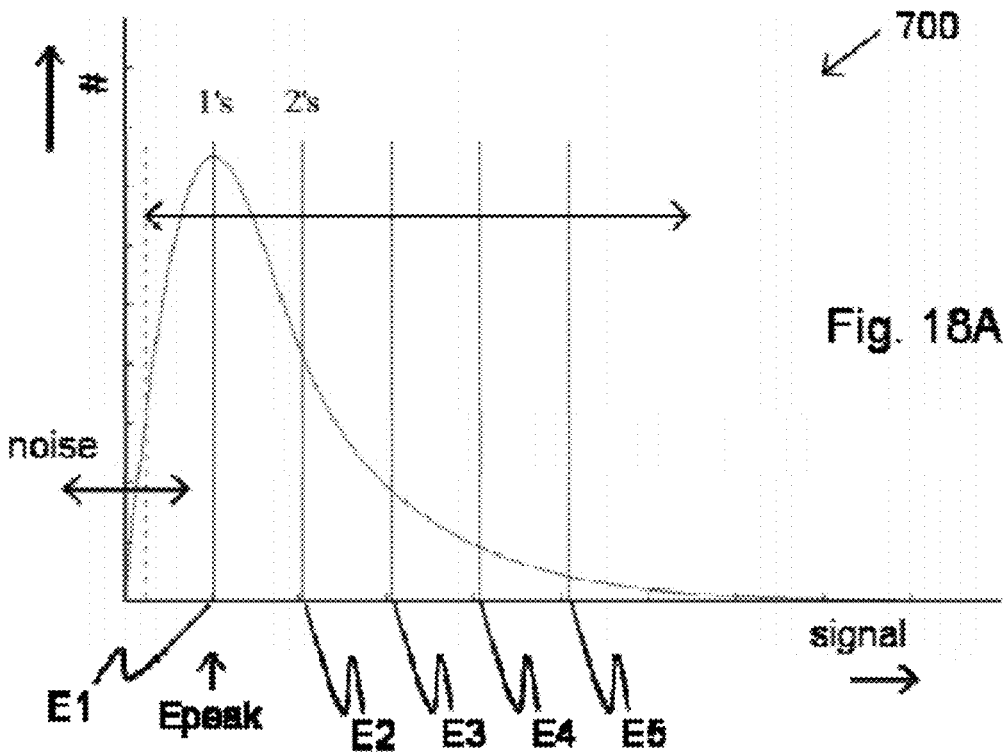
FIG. 18A and FIG. 18B schematically illustrate signal levels of a pixel signal.
Figure 18B:
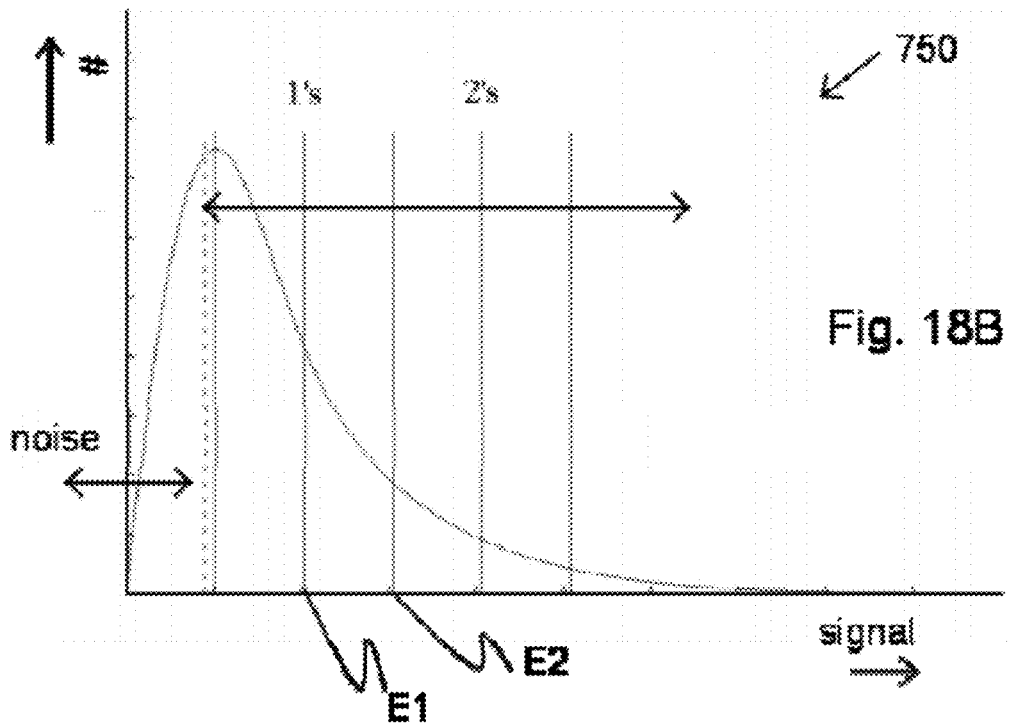

FIG. 18A and FIG. 18B schematically illustrates frequency of occurrence of a signal level from a pixel when one electron is incident on the pixel of a typical semiconductor sensor. Signal level is increasing along the horizontal axis, relative frequency of occurrence is increasing along the vertical axis. Curve 702 indicates the frequency of occurrence of the signal level. Curve 702 is approximately a Landau-distribution. Curve 702 shows a clear peak at a signal level indicated with Epeak. Arrow 704 indicates the dark current noise of the semiconductor sensor.

FIG. 18A and FIG. 18B also shows examples of reference levels used to define an energy bin or a multiplicity of electrons as used in the internal states. Below, we will refer to reference levels defining the 'number of electrons' on a single pixel in a state (cf. the first embodiment), but the reader shall understand that this may also be interpreted as 'energy bin' of an electron in a state (cf. the second embodiment).

In FIG. 18A, the reference level E1, associated with the number of electrons in a single pixel of a state being one, is chosen to correspond to the peak Epeak of the curve 702. It may however also be observed that the noise level extends well beyond halve the peak value. Using such choice for the reference level may thus have a risk of a relatively high 'false positives' where an electron is detected without actual an electron being incident on the detector. However, such choice may advantageously have relatively few little 'false negatives' where no electron is detected despite it being present.

Reference levels E2, E3, E4 and E5, associated respectively with two, three, four and five electrons on one pixel, are selected and used to define states accordingly, in order to also detect electrons with a higher pixel signal, i.e. a larger energy deposit, with a sufficient reliability. Thus, in the embodiment of FIG. 18A, $$En = n*Epeak, n=1, \ldots, N,$$

with N preferably being 4, 5 or larger.

In FIG. 18B, the reference level E1, associated with the number of electrons in a single pixel of a state being one, is chosen to correspond to twice the value of the peak Epeak of the curve 702, Further reference levels are chosen as multiples of E1, or $$En = n*2*Epeak, n=1, \ldots, N,$$

with N preferably being 2 or 3. Using such choice for the reference levels may reduce the number of states significantly, but may have the risk that several electrons with only a low deposited energy are not detected as electrons, but being overseen as noise.

Figure 19:
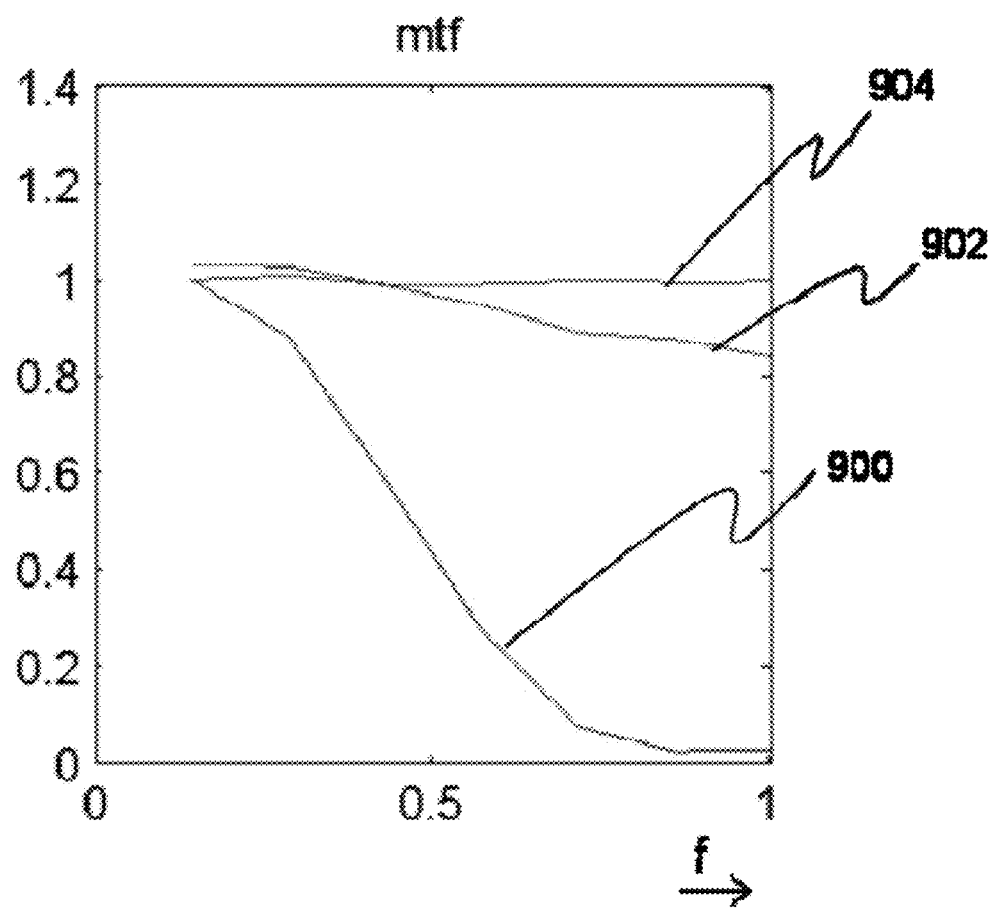
FIG. 19 shows a result of a simulation of a method according to the invention.

It will be understood that other choices of reference levels may be used. The choice of reference levels and their number may e.g. be selected based on available resources for the Viterbi Detection, such as computational power, available memory size and available computation time per image, or e.g. on required image quality of the reconstructed image FIG. 19 shows a result of a simulation of a method according to the invention. The method used in the simulation uses a dose of 0.01, i.e. with an average number of 1 electron on 100 pixels, a PSF=$(13531)^2$, 15 positions per state (cf. 661 in FIG. 17), maximum 2 electrons per state, with the reference level for a single electron being selected as twice the peak value of curve 702. The simulation uses a CMOS semiconductor sensor used in a TEM and electrons of typical energy when analysing a biological sample at such low dose. FIG. 19 shows the Modulation Transfer Function, which is a measure of the resolution obtained. The horizontal axis corresponds to a frequency of a repeating pattern, and extends from zero to the Nyquist frequency. The vertical axis is the relative output level from such repeating patterns. It is observed that the MTF 900 of the detector itself, i.e. of the raw data signals, is already smaller than 0.5 at half the Nyquist frequency. The output 902 of the Viterbi Detector however remains above 0.8 until the Nyquist frequency. The Viterbi Detector thus allows to substantially recover the full pixel resolution of the sensor, which is indicated by line 904.

Figure 20:
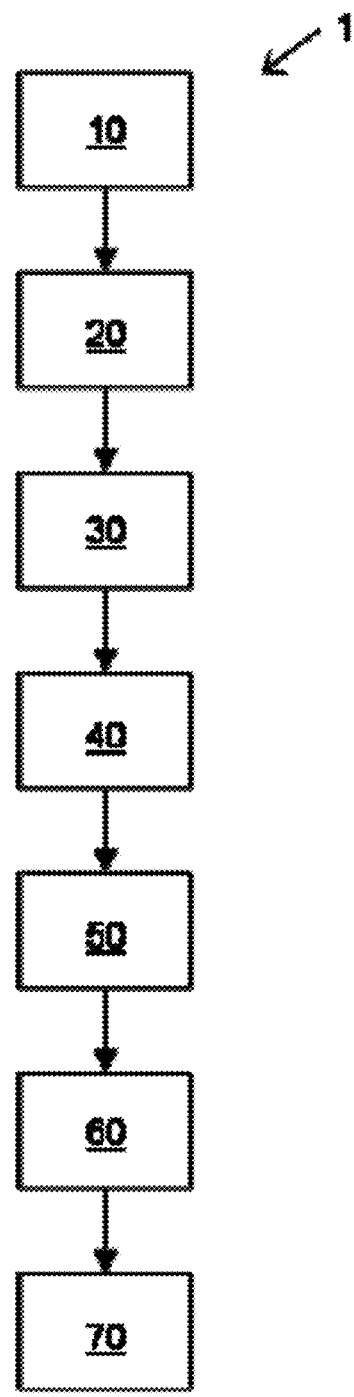
FIG. 20 schematically shows an overview of a method according to an embodiment.

FIG. 20 schematically shows an overview of a method according to an embodiment.

The method 1 shown in FIG. 20 comprises:
producing 10 a beam of particles,
placing 20 an object 111 to be imaged on an object plane,
illuminating 30 the object plane with the beam of particles,
forming 40 an image of the object plane by imaging particles transmitted through the object on an image plane, and
detecting 50 the image with the detector comprising the semiconductor sensor and providing a plurality of pixel signals from the respective pixels of the array in response to the particles incident on the detector,
receiving 60 the plurality of pixel signals by a Viterbi Detector, and
determining 70 a reconstructed image from using Viterbi Detection on the plurality of pixel signals by the Viterbi Detector, the Viterbi Detection using a plurality of different states corresponding to a plurality of configurations of particles incident on the detector, and at least two states of the plurality of different states corresponding to a same, non-zero multiplicity of incident particles on a single pixel of the plurality of pixel signals.

Figure 21:
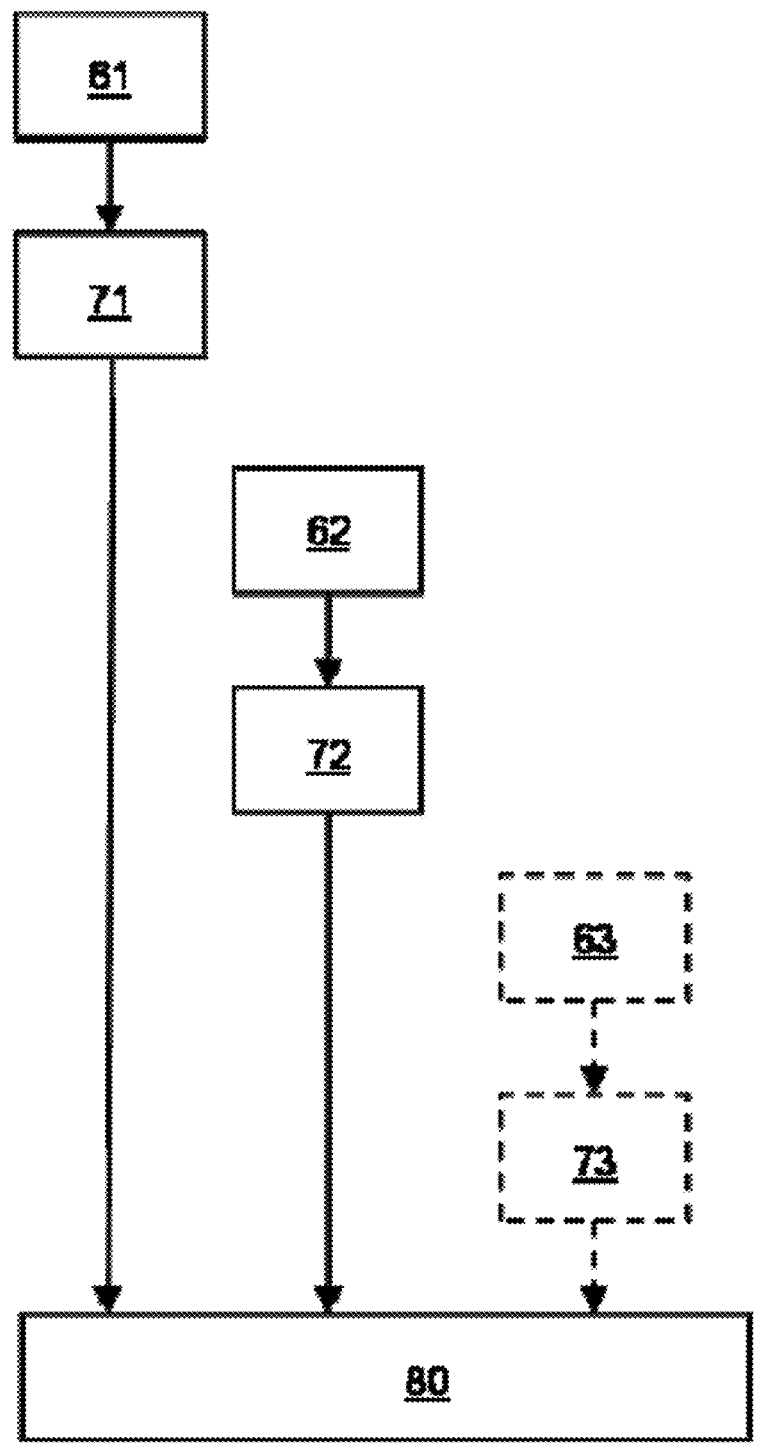
FIG. 21 schematically illustrates a further embodiment.

The determining 70 may be performed according to any one of the embodiments described above, to any useful combination of two or more of the embodiments described above or to a modification of any one of the embodiments or their combination. FIG. 21 schematically illustrates a further embodiment. In the embodiment of FIG. 21, the method comprises receiving 61a first plurality of pixel signals from respective pixels of the array in response to particles incident on the detector upon detecting a first image of the object and determining 71a first reconstructed image from using the Viterbi Detection on the first plurality of pixel signals. The Viterbi Detection may be performed according to any of the embodiments described above, The method further comprises receiving 62 a second plurality of pixel signals from the respective pixels of the array in response to particles incident on the detector upon detecting a second image of the object and determining 72 a second reconstructed image from using the Viterbi Detection on the second plurality of pixel signals. As indicated with dashed lines, the method may further comprise receiving 63 at least one further plurality of pixel signals from the respective pixels of the array in response to particles incident on the detector upon detecting at least one respective further image of the object and determining 73 at least one further reconstructed image from using the Viterbi Detection on the respective further plurality of pixel signals. The method then combines 80 the first reconstructed image, the second reconstructed image and, if appropriate, the at least one further reconstructed images to form the reconstructed image.

Figure 22:
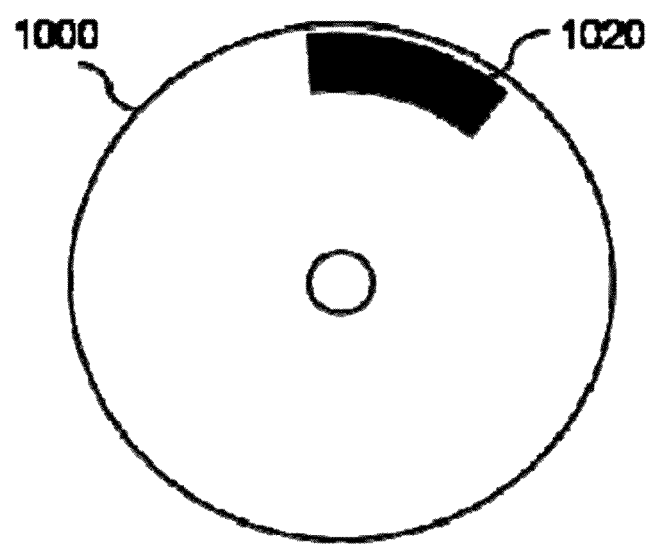
FIG. 22 shows a computer readable medium comprising a computer program product.

FIG. 22 shows a computer readable medium 500 comprising a computer program 1020, the computer program 1020 comprising instructions for causing a processor system to perform a method according to an embodiment. The computer program 1020 may be embodied on the computer readable medium 1000 as physical marks or by means of magnetization of the computer readable medium 1000. However, any other suitable embodiment is conceivable as well. Furthermore, it will be appreciated that, although the computer readable medium 1000 is shown in FIG. 22 as an optical disc, the computer readable medium 1000 may be any suitable computer readable medium, such as a hard disk, solid state memory, flash memory, etc., and may be non-recordable or recordable.

It will be appreciated that the invention also applies to computer programs, particularly computer programs on or in a carrier, adapted to put the invention into practice. The program may be in the form of a source code, an object code, a code intermediate source and an object code such as in a partially compiled form, or in any other form suitable for use in the implementation of the method according to the invention. It will also be appreciated that such a program may have many different architectural designs. For example, a program code implementing the functionality of the method or system according to the invention may be sub-divided into one or more sub-routines. Many different ways of distributing the functionality among these sub-routines will be apparent to the skilled person. The sub-routines may be stored together in one executable file to form a self-contained program. Such an executable file may comprise computer-executable instructions, for example, processor instructions and/or interpreter instructions (e.g. Java interpreter instructions). Alternatively, one or more or all of the sub-routines may be stored in at least one external library file and linked with a main program either statically or dynamically, e.g. at run-time. The main program contains at least one call to at least one of the sub-routines. The sub-routines may also comprise function calls to each other. An embodiment relating to a computer program product comprises computer-executable instructions corresponding to each processing step of at least one of the methods set forth herein. These instructions may be sub-divided into sub-routines and/or stored in one or more files that may be linked statically or dynamically. Another embodiment relating to a computer program product comprises computer-executable instructions corresponding to each means of at least one of the systems and/or products set forth herein. These instructions may be sub-divided into sub-routines and/or stored in one or more files that may be linked statically or dynamically.

The carrier of a computer program may be any entity or device capable of carrying the program. For example, the carrier may include a storage medium, such as a ROM, for example, a CD ROM or a semiconductor ROM, or a magnetic recording medium, for example, a hard disk. Furthermore, the carrier may be a transmissible carrier such as an electric or optical signal, which may be conveyed via electric or optical cable or by radio or other means. When the program is embodied in such a signal, the carrier may be constituted by such a cable or other device or means. Alternatively, the carrier may be an integrated circuit in which the program is embedded, the integrated circuit being adapted to perform, or used in the performance of, the relevant method.

In this document, the term "particles" does not include photons, but refers to particles with a rest energy different from zero. The term "particles" may in particular relate to electrons. The particle-optical apparatus may e.g. comprise a TEM.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

Although the present invention and its advantages have been described in detail, it should be understood that various changes, substitutions, and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

I claim as follows:

1. Method for determining a reconstructed image using a particle-optical apparatus, the particle-optical apparatus comprising:
   a particle source for producing a beam of particles,
   an object plane on which an object to be imaged may be placed,
   a condenser system for illuminating the object plane with the beam of particles,
   a projection system for forming an image of the object plane by imaging particles transmitted through the object on an image plane, and
   a detector for detecting the image, the detector comprising a semiconductor sensor having an array of pixels for providing a plurality of pixel signals from respective pixels of the array in response to particles incident on the detector, the method comprising:
   receiving the plurality of pixel signals, and
   determining a reconstructed image using Viterbi Detection on the plurality of pixel signals, by:
   modelling possible states of a path corresponding to a plurality of possible configurations incident on the detector by determining a plurality of possible state transitions between the pixels, wherein the states are characterized by a run-length constraint that there should be at least two '0's between two '1's;
   determining the path of state transitions having the highest probability of producing the plurality of pixel signals, and
   determining from the path of state transitions having the highest probability of producing the plurality of pixel signals, the configuration of particles incident on the detector; and
   modifying an output of the Viterbi detection by adjusting the determined configuration of particles incident on the detector to define:
   the modified output to be zero particles for pixels having zero particles in the output of the Viterbi detection, and
   the modified output to be one particle for pixels having one or more particles in the output of the Viterbi detection.

2. Method according to claim 1, wherein the states are modelled using a different multiplicity of particles.

3. Method according to claim 1, wherein the states are modelled using different deposited energies of the particle(s).

4. Method according to claim 1, wherein the states are modelled using different point spread functions in modelling deposited energies of the particle(s).

5. Method according to claim 1, wherein the states are used in different iterations of the Viterbi Detection.

6. Method according to claim 1, wherein the array of pixels is a one-dimensional array.

7. Method according to claim 1, wherein the array of pixels is a two-dimensional array and the Viterbi Detection is applied to sequences of pixel signals per row of pixels of the two-dimensional array.

8. Method according to claim 1, wherein the array of pixels is a two-dimensional array and the Viterbi Detection is applied to sequences of pixel signals per column of pixels of the two-dimensional array.

9. Method according to claim 7, wherein the states of the Viterbi Detection correspond to predetermined two-dimensional configurations of particles incident on the detector.

10. Method according to claim 1, further comprising, after having detected one or more incident particles on a pixel, removing a contribution from the detected one or more incident particles from the plurality of pixel signals.

11. Method according to claim 1, wherein the image detected by the detector comprises a dose in a range of 0.0001-0.5 particles per pixel.

12. Method according to claim 1, the method further comprising:
receiving a second plurality of pixel signals from the respective pixels of the array in response to particles incident on the detector upon detecting a second image of the object,
determining a second reconstructed image using Viterbi Detection on the second plurality of pixel signals by:
modelling possible states of a path corresponding to a plurality of possible configurations of particles incident on the detector in detecting the second image by determining a plurality of possible state transitions between the pixels, wherein the states are characterized by a run-length constraint that there should be at least two '0's between two '1's;
determining the path of state transitions having the highest probability of producing the second plurality of pixel signals, and
determining from the path of state transitions having the highest probability of producing the second plurality of pixel signals, a second configuration of particles incident on the detector; and
modifying the output of the Viterbi detection on the second plurality of pixel signals by adjusting the second determined configuration of particles incident on the detector to define:
the modified output to be zero particles for pixels having zero particles in the output of the Viterbi Detection, and
the modified output to be one particle for pixels having one or more particles in the output of the Viterbi detection, and
combining the modified output of the Viterbi Detection for the first reconstructed image and the modified output of the Viterbi Detection for the second reconstructed image to form a combined reconstructed image.

13. Method according to claim 1, further comprising:
producing a beam of particles,
placing an object to be imaged on an object plane,
illuminating the object plane with the beam of particles,
forming an image of the object plane by imaging particles transmitted through the object on an image plane, and
detecting the image with the detector comprising the semiconductor sensor and providing a plurality of pixel signals from the respective pixels of the array in response to the particles incident on the detector.

14. Particle-optical apparatus comprising:
a particle source for producing a beam of particles,
an object plane on which an object to be imaged may be placed,
a condenser system for illuminating the object plane with the beam of particles,
a projection system for forming an image of the object plane by imaging particles transmitted through the object on an image plane,
a detector for detecting the image, the detector comprising a semiconductor sensor having an array of pixels for providing a plurality of pixel signals from respective pixels of the array in response to particles incident on the detector, and
a signal processor configured to perform the method of claim 1.

15. A computer program hardware product carrying instructions for causing a processor system to perform the method according to claim 1.

16. A method according to claim 8, wherein the states of the Viterbi Detection correspond to predetermined two-dimensional configurations of particles incident on the detector.

17. A method for determining a reconstructed image using a particle-optical apparatus, comprising:
providing a particle optical apparatus having a detector for detecting an image, the detector providing a plurality of pixel signals from respective pixels in response to particles incident on the detector;
receiving the plurality of pixel signals;
determining a reconstructed image using Viterbi detection on the plurality of pixel signals, by:
modelling possible states of a path corresponding to a plurality of possible configurations incident on the detector by determining a plurality of possible state transitions between the pixels, wherein the states are characterized by a run-length constraint that there should be at least two '0's between two '1's;
determining the path of state transitions having the highest probability of producing the plurality of pixel signals, the most likely configuration of particles incident on the detector; and
modifying a Viterbi output by adjusting the determined configuration of particles incident on the detector to define:
the modified output to be zero particles for pixels having zero particles in the output of the Viterbi detection, and
the modified output to be one particle for pixels having one or more particles in the output of the Viterbi detection.

18. The method of claim 17, wherein the different states are modelled using a different multiplicity of particles.

19. The method of claim 17, wherein the different states are modelled using different deposited energies of the particle(s).

20. The method of claim 17, wherein the different states are modelled using different point spread functions in modelling deposited energies of the particle(s).

* * * * *